US010176431B2

(12) United States Patent
Yeh et al.

(10) Patent No.: US 10,176,431 B2
(45) Date of Patent: Jan. 8, 2019

(54) LOW-NOISE, ULTRA-LOW TEMPERATURE DISSIPATIVE DEVICES

(71) Applicant: University of Maryland, College Park, College Park, MD (US)

(72) Inventors: Jen-Hao Yeh, Arlington, VA (US); Benjamin S. Palmer, Silver Spring, MD (US); Frederick C. Wellstood, Fairfax, VA (US); Jay LeFebvre, Fairfield, CT (US)

(73) Assignees: University of Maryland, College Park, College Park, MD (US); The United States of America, as represented by the Director, National Security Agency, Washington, DC (US)

( * ) Notice: Subject to any disclaimer, the term of this patent is extended or adjusted under 35 U.S.C. 154(b) by 0 days.

(21) Appl. No.: 15/448,284

(22) Filed: Mar. 2, 2017

(65) Prior Publication Data

US 2017/0257074 A1 Sep. 7, 2017

Related U.S. Application Data

(60) Provisional application No. 62/302,521, filed on Mar. 2, 2016, provisional application No. 62/454,191, filed on Feb. 3, 2017.

(51) Int. Cl.
*H01P 1/24* (2006.01)
*G06N 99/00* (2010.01)
(Continued)

(52) U.S. Cl.
CPC ........... *G06N 99/002* (2013.01); *H01P 1/227* (2013.01); *H01P 5/185* (2013.01); *H03H 7/24* (2013.01)

(58) Field of Classification Search
CPC ...... H01P 5/18; H01P 1/24; H01P 3/08; H01P 5/02; H01L 39/22; H01L 39/223; H01L 39/24; H01L 27/18
(Continued)

(56) References Cited

U.S. PATENT DOCUMENTS

| 4,567,767 A * | 2/1986 | Quate | ................... G01H 3/125 |
| | | | 505/842 |
| 8,951,808 B2 * | 2/2015 | Ladizinsky | ............ B82Y 10/00 |
| | | | 438/2 |

(Continued)

OTHER PUBLICATIONS

Yeh et al., Microwave attenuators for use with quantum devices below 100mK, 2017, Journal of Applied Physics, 121, 224501-1, 8 pages.*

(Continued)

*Primary Examiner* — Dean Takaoka
(74) *Attorney, Agent, or Firm* — Shapiro, Gabor and Rosenberger, PLLC

(57) ABSTRACT

A dissipative device has a planar configuration with one or more resistor elements formed on an insulating substrate. Conductors are formed on the insulating substrate and are coupled to the resistor element(s) to transmit signals to/from the resistor element(s). The geometry of and materials for the dissipative device allow the conductors to act as heat sinks, which conduct heat generated in the resistor element(s) to the substrate (and on to a coupled housing) and cool hot electrons generated by the resistor element(s) via electron-phonon coupling. The dissipative device can be used in cooling a signal to a qubit, a cavity system of a quantum superconducting qubit, or any other cryogenic device sensitive to thermal noise.

21 Claims, 13 Drawing Sheets

(51) Int. Cl.
*H01P 1/22* (2006.01)
*H01P 5/18* (2006.01)
*H03H 7/24* (2006.01)
*H01P 3/08* (2006.01)
*H01P 5/02* (2006.01)

(58) Field of Classification Search
USPC .................. 333/109, 99 S; 338/23; 257/31
See application file for complete search history.

(56) References Cited

U.S. PATENT DOCUMENTS

| | | | | |
|---|---|---|---|---|
| 9,490,296 | B2* | 11/2016 | Ladizinsky | ............ B82Y 10/00 |
| 2013/0258595 | A1* | 10/2013 | Tuckerman | ......... H01L 23/3677 |
| | | | | 361/701 |
| 2017/0098682 | A1* | 4/2017 | Ladizinsky | ............ B82Y 10/00 |

OTHER PUBLICATIONS

Ramos et al., Design for Effective Thermalization of Junctions for Quantum Coherence, Mar. 2001, IEEE, vol. 11, No. 1, 4 pages.*

Pleikies et al., Hot-Electron effect in PdAu thin-film resistors with attached cooling fins, 2009, Superconductor Science and Technology, 9 pages.*

Nachrodt et al., Ti/Ni(80%)Cr(20%) Thin-Film Resistor With a Nearly Zero Temperature Coefficient of Resistance for Integration in a Standard CMOS Process, Mar. 2008, IEEE, vol. 29, No. 3, 3 pages.*

Cano et al., "Ultra-wideband chip attenuator for precise noise measurements at cryogenic temperatures," *IEEE Transactions on Microwave Theory and Techniques*, Sep. 2010, 58(9): pp. 2504-2510.

Clerk et al., "Using a qubit to measure photon-number statistics of a driven thermal oscillator," *Physical Review A*, 2007, 75(042302): pp. 1-12.

Collin, R.E., *Foundations of Microwave Engineering*, Second Edition, 2001, John Wiley & Sons, Inc., New York, NY.

Little, W.A., "The transport of heat between dissimilar solids at low temperatures," *Canadian Journal of Physics*, 1959, 37: pp. 334-349.

Roukes et al., "Hot electrons and energy transport in metals at milliKelvin temperatures," *Physical Review Letters*, Jul. 1985, 55(4): pp. 422-425.

Schoelkopf et al., "Qubits as spectrometers of quantum noise," in *Quantum Noise is Mesoscopic Physics*, Nazarov, Y.K. (editor), 2003, Kluwer Academic Publishers, pp. 175-203.

Sears et al., "Photon shot noise dephasing in the strong-dispersive limit of circuit QED," *Physical Review B*, 2012, 86(180504): pp. 1-5.

Valente et al., "High-performance microstrip directional coupler for radio-astronomical receivers at cryogenic temperatures," *Electronics Letters*, Mar. 2014, 50(6): pp. 449-451.

Wellstood et al., "Hot-electron effects in metals," *Physical Review B*, Mar. 1994, 49(9): pp. 5942-5955.

* cited by examiner

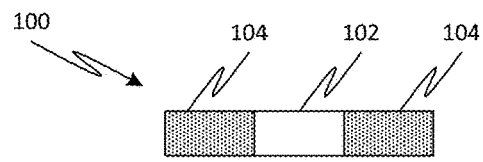
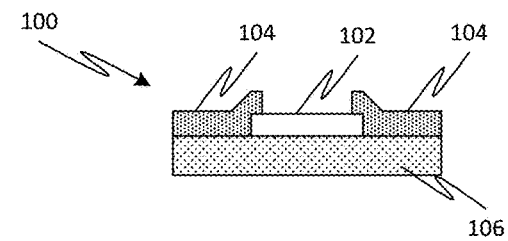
FIG. 1A  FIG. 1B
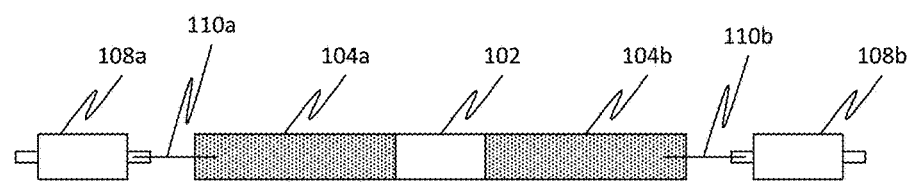
FIG. 2A
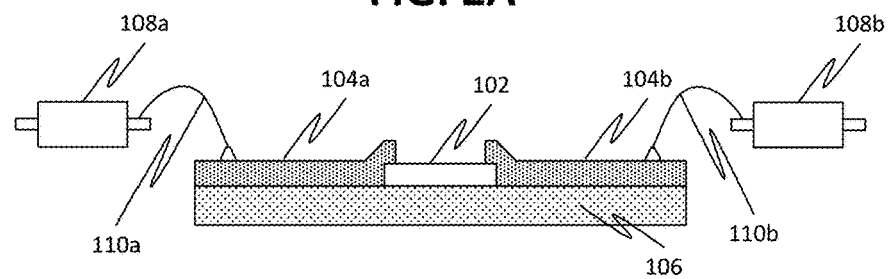
FIG. 2B
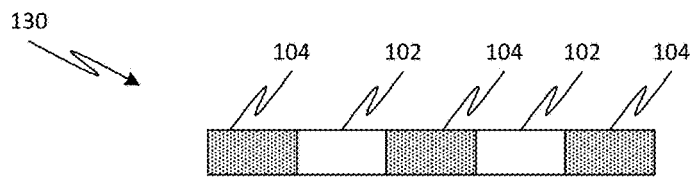
FIG. 3A
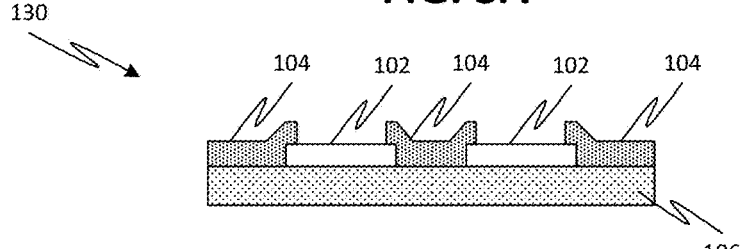
FIG 3B

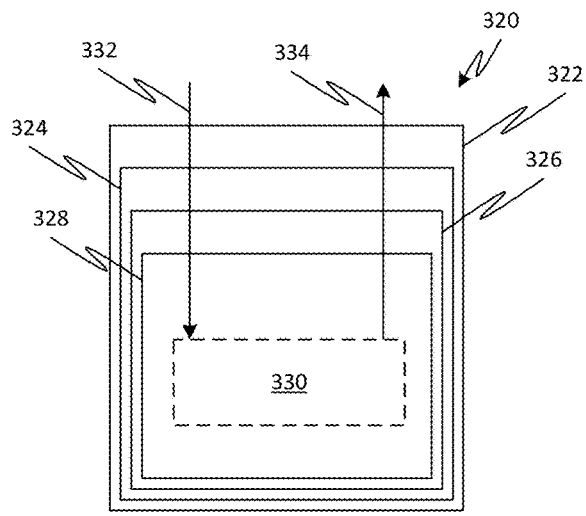
FIG. 17A
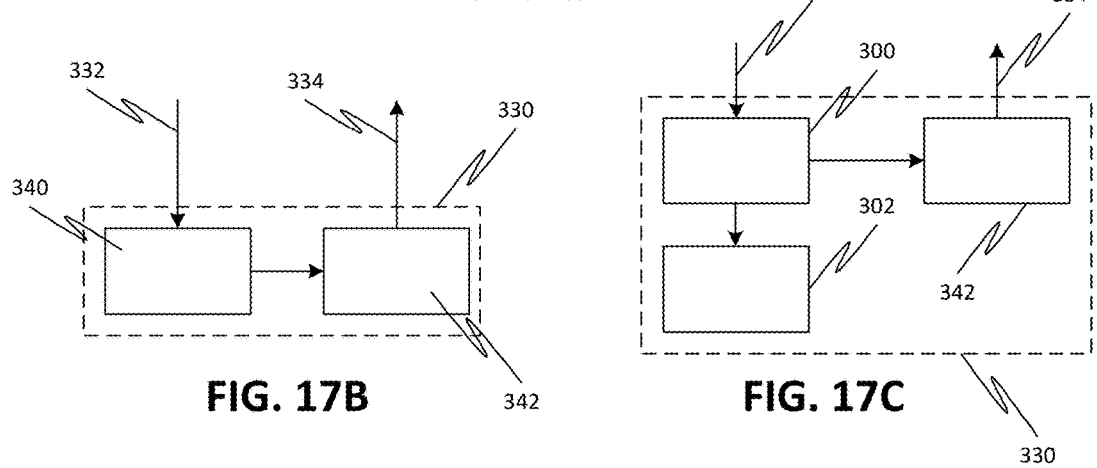
FIG. 17B  FIG. 17C
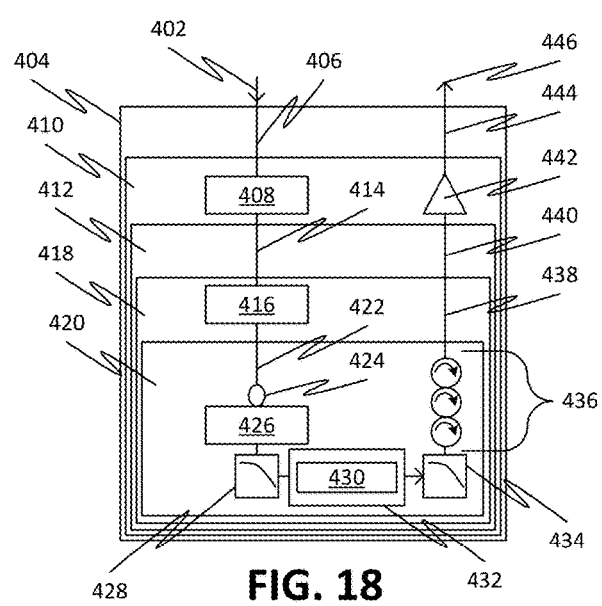
FIG. 18

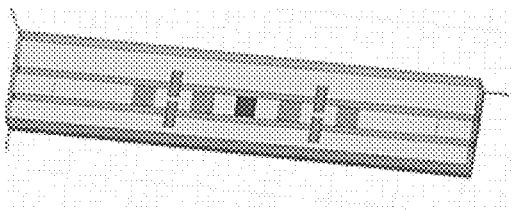 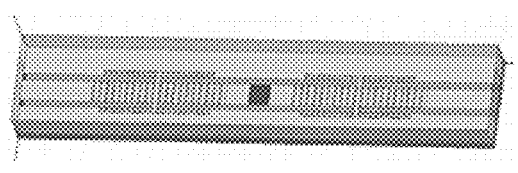
FIG. 21A     FIG. 21B
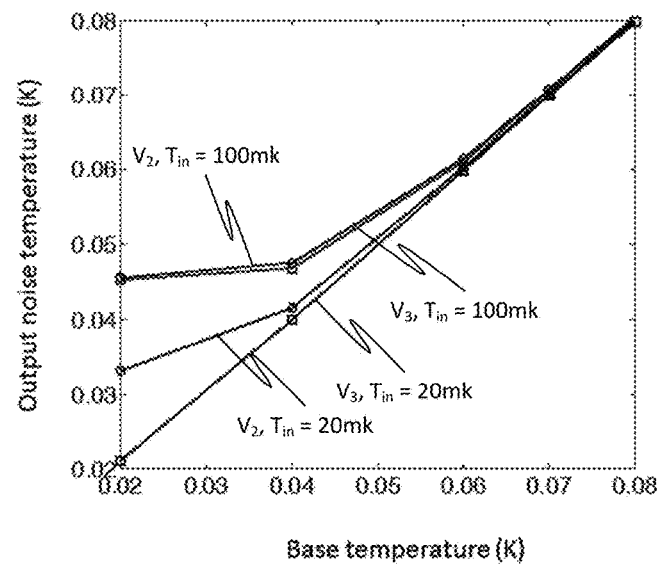
FIG. 22
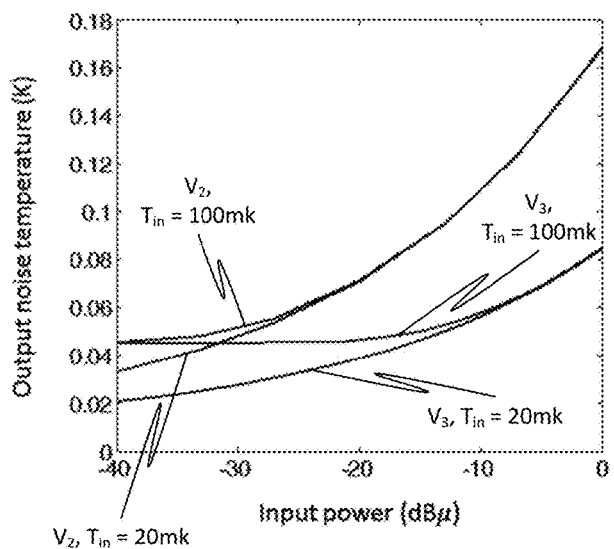
FIG. 23

LOW-NOISE, ULTRA-LOW TEMPERATURE DISSIPATIVE DEVICES

CROSS-REFERENCE TO RELATED APPLICATIONS

The present application claims the benefit of U.S. Provisional Application No. 62/302,521, filed Mar. 2, 2016, and U.S. Provisional Application No. 62/454,191, filed Feb. 3, 2017, both of which are hereby incorporated by reference herein in their entirety.

STATEMENT REGARDING FEDERALLY SPONSORED RESEARCH

This invention was made with government support under H9823011C0301 awarded by the National Security Agency (NSA). The government has certain rights in the invention.

FIELD

The present disclosure generally relates to dissipative devices, and, more particularly, to dissipative devices operating at ultra-low cryogenic temperatures (e.g., less than 1K) with minimal thermal noise.

SUMMARY

In embodiments, a dissipative device has a planar configuration with one or more resistor elements formed on an insulating substrate. Conductors are also formed on the insulating substrate and are coupled to the resistor element(s) to transmit signals to/from the resistor element(s). Appropriate selections for the geometry of and materials for the dissipative device allow the conductors to act as heat sinks, which conduct heat generated in the resistor element(s) to the underlying substrate and cool hot electrons generated by the resistor element(s) via electron-phonon coupling. Such a dissipative device can be a component of a device used to cool (i.e., reduce thermal noise in) an input signal to a qubit, a cavity system of a quantum superconducting qubit, or any other cryogenic device sensitive to thermal noise.

In one or more embodiments, a dissipative device has a substrate, at least one resistor element and at least two heat sinks. Each resistor element is in contact with the substrate and has first and second ends in plan view. Each resistor element comprises a first material having a first electrical conductivity value. Each heat sink is also in contact with the substrate. One of the heat sinks is coupled to the first end in plan view, while another of the heat sinks is coupled to the second end in plan view. Each heat sink comprises a second material having a second electrical conductivity value higher than the first electrical conductivity value. The at least two heat sinks are constructed to conduct heat generated in the at least one resistor element to the substrate and to cool hot electrons generated by the at least one resistor element via electron-phonon coupling.

In one or more embodiments, a system has a refrigerator and a first dissipative device. The refrigerator has a mixing chamber and maintains a temperature of the mixing chamber below 100 mK. The first dissipative device is coupled to the mixing chamber and has a first substrate, at least one first resistor element, and at least two first heat sinks. Each first resistor element is in contact with the first substrate and has first and second ends in plan view. The first resistor element comprises a first material having a first electrical conductivity value. Each first heat sink is in contact with the first substrate. One of the first heat sinks is coupled to the first end in plan view while another of the first heat sinks is coupled to the second end in plan view. Each first heat sink comprises a second material having a second electrical conductivity value higher than the first electrical conductivity value. The at least two first heat sinks are constructed to conduct heat generated in the at least one first resistor element to the first substrate and to cool hot electrons generated by the at least one first resistor element via electron-phonon coupling.

In one or more embodiments, a fabrication method comprises forming a first material on a substrate. The first material has a first electrical conductivity value. The fabrication method further comprises patterning the first material to form at least one resistor element in contact with the substrate. Each resistor element has first and second ends in plan view. The fabrication method further comprises, after the patterning, forming at least two heat sinks in contact with the substrate. One of the heat sinks is coupled to the first end in plan view, while another of the heat sinks is coupled to the second end in plan view. Each heat sink comprises a second material having a second electrical conductivity value higher than the first electrical conductivity value.

Objects and advantages of embodiments of the disclosed subject matter will become apparent from the following description when considered in conjunction with the accompanying drawings.

BRIEF DESCRIPTION OF THE DRAWINGS

Embodiments will hereinafter be described with reference to the accompanying drawings, which have not necessarily been drawn to scale. Where applicable, some features may not be illustrated to assist in the illustration and description of underlying features. Throughout the figures, like reference numerals denote like elements.

FIGS. 1A and 1B are plan and cross-sectional views, respectively, illustrating basic elements of a dissipative device, according to one or more embodiments of the disclosed subject matter.

FIGS. 2A and 2B are plan and cross-sectional views, respectively, illustrating a dissipative device connected to input/output ports, according to one or more embodiments of the disclosed subject matter.

FIGS. 3A and 3B are plan and cross-sectional views, respectively, illustrating a dissipative device employing multiple resistor elements in series, according to one or more embodiments of the disclosed subject matter.

FIG. 17A is a simplified schematic diagram of a cryogenic refrigeration system for cooling a dissipative device, according to one or more embodiments of the disclosed subject matter.

FIGS. 17B and 17C illustrate configurations thermally coupled to the mixing chamber of the cryogenic refrigeration system for an attenuator setup and a directional coupler setup, respectively, according to one or more embodiments of the disclosed subject matter.

FIG. 18 is a simplified schematic diagram of a cryogenic refrigeration system for filtering and thermalizing a microwave signal for a qubit using the dissipative device as an attenuator, according to one or more embodiments of the disclosed subject matter.

FIGS. 21A and 21B are top perspective views of an attenuator device ($V_2$) employing multiple attenuator cells according to the configuration of FIG. 12 and an attenuator device ($V_3$) employing multiple attenuator cells according to the configuration of FIG. 14, respectively, according to one or more embodiments of the disclosed subject matter.

FIG. 22 is a graph of output noise temperature for the attenuator devices of FIGS. 21A-21B versus base temperature of the mixing chamber, with input noise temperatures $T_{in}=20$ mK or $T_{in}=100$ mK.

FIG. 23 is a graph of output noise temperature for the attenuator devices of FIGS. 21A-21B versus input power, with input noise temperatures $T_{in}=20$ mK or $T_{in}=100$ mK.

DETAILED DESCRIPTION

Figure 4A:
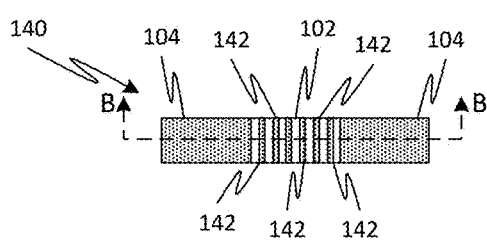
FIGS. 4A and 4B are plan and cross-sectional views, respectively, illustrating a dissipative device employing heat sink islands on a surface of the resistor element, according to one or more embodiments of the disclosed subject matter.

In embodiments, a dissipative device has a planar configuration a resistor element and conductors coupled to the resistor element to transmit signal to/from the resistor element. As used herein, the term "dissipative" refers to elements that dissipate energy, such as resistors, or combinations thereof, such as a resistor circuit forming an attenuator. Both the resistor element and the conductors are formed on a common insulating substrate. The geometry of and materials for the dissipative device are selected such that the conductors act as heat sinks, which conduct heat generated in the resistor element to the substrate (and thereby to a housing coupled to the substrate) and cool hot electrons generated by the resistor element via electron-phonon coupling.

In embodiments, the geometry of and materials for the dissipative device can also be selected such that the volume of the resistor elements and their contact area with the substrate are maximized, or at least increased. Thus, an additional channel (e.g., from resistor element to substrate and on to the housing) is improved for cooling hot electrons generated by the resistor element via electron-phonon coupling.

As a result, the dissipative device can be used in cryogenic applications while introducing minimal, or at least reduced, thermal noise. For example, the dissipative device can be part of device that cools (i.e., reduce thermal noise in) an input signal to a qubit, a cavity system of a quantum superconducting qubit, or any other cryogenic device sensitive to thermal noise. For example, the dissipative device can be formed as or part of an attenuator, directional coupler, or other dissipative cryogenic microwave device.

Referring to FIGS. 1A-1B, simplified plan and cross-sectional views of basic elements of a dissipative device 100 are shown. The dissipative device 100 includes a resistor element 102 coupled at opposite ends thereof to a pair of conductors 104. The resistor element 102 converts a portion of a signal's electrical energy into heat, which would otherwise contribute to thermal noise of the dissipative device when operated at cryogenic temperatures. However, the geometry of and materials for the dissipative device are selected such that the conductors 104 act as heat sinks, which conduct heat generated in the resistor element to the substrate 106 and cool hot electrons generated by the resistor element via electron-phonon coupling.

The conductors 104 are formed of a material that has good electrical conductivity and good thermal conductivity. Thus, the material for the conductors 104 will have an electrical conductivity that is higher (e.g., by at least an order of magnitude) than the electrical conductivity of the material for the resistor element 102. Since superconductivity could impede thermal flow due to Andreev reflection, the material for the conductors 104 is one that does not become superconductive at ultra-low temperatures (i.e., less than 1K, more particularly, less than 10 mK). For example, the conductors 104 can be formed of silver (Ag), gold (Au), copper (Cu), or another noble metal.

The thickness of the conducting film 104 can be large to help the cooling via electron-phonon coupling, subject to limitations of the fabrication technique (e.g., photolithography). Moreover, an additional thin film (not shown, generally having a thickness of about 10 nm) can be provided between the conductor 104 and the substrate 106 to enhance adhesion between the two materials. For example, the conductor 104 is a 1 µm Ag film, the substrate 106 is quartz, and the thin film is a 10 nm titanium/gold (Ti/Au) film.

The resistor element 102 is formed of a material that has a relatively large resistivity that does not substantially change with temperature. The small temperature dependence of resistivity allows design and testing at high temperatures (e.g., room temperature) to be correlated with operation at ultra-low temperatures. Moreover, since superconductivity would obviate the resistive function, the material for the resistor element 102 is one that does not become superconductive at ultra-low temperatures.

For example, the resistor element 102 can be formed of an alloy of nickel (Ni), such as an alloy of nickel and chromium (Cr) (e.g., nichrome, which has a composition of 80 wt % Ni and 20 wt % Cr). Nichrome has a stable resistivity that only changes by ~10% when cooled to ultra-low temperatures. Moreover, nichrome has a relatively large resistivity (i.e., $1\times10^{-6}$ ohm-m) and a temperature coefficient of resistance of $0.4\times10^{-3}$ per K.

Alternatively, the resistor element 102 can be formed of a pure metal, a metal oxide, or an alloy so long as the materials exhibit a small variation in resistivity (i.e., temperature coefficient of resistance less than $\sim 1\times10^{-1}$ per K or have a resistivity that changes less than 0.1% per K), do not become superconductive at ultra-low temperatures, and have relatively large electron-phonon coupling. Such materials can include, but are not limited to, tantalum nitride (TaN) or an alloy of Ni with a metal selected from Cu, manganese (Mn), or Cr. For example, manganin (86 wt % Cu, 12 wt % Mn, and 2 wt % Ni) and constantan (55 wt % Cu and 45 wt % Ni) both have small variation in resistivity and can be used for the resistor element 102.

The substrate 106 is formed of an insulating material with relatively large thermal conductivity (e.g., greater than 1 $Wm^{-1} K^{-1}$) at ultra-low temperatures and small relative permittivity (Er) (e.g., less than 15, and preferably less than or equal to 3.9). The large thermal conductivity allows heat generated by the resistor element 102 to be conducted away, directly from the resistor element 102 (e.g., via the contact surface between the resistor element and the substrate) and/or via conductors 104. The small relative permittivity allows the resistor element 102 to be made larger for the same microwave bandwidth requirement, as well as improving thermalization efficiency.

For example, the substrate 106 can be formed of fused quartz or single crystal quartz. Other materials that exhibit similarly good thermal conductivity, small relative permittivity, and/or high electrical resistivity (i.e., to be sufficiently electrically insulating) are also possible according to one or more contemplated embodiments. For example, the substrate 106 can be formed of sapphire or high-resistance silicon (e.g., where high-resistance refers to a resistivity greater than 40 ohm-cm).

Both the resistor element 102 and the pair of conductors 104 are formed in a substantially planar configuration on a common insulating substrate 106. The conductors 104 can overlap with the resistor element 102 at respective ends thereof (as shown in FIG. 1B) to provide sufficient electrical contact therebetween. Despite the overlap, the conductors 104 and resistor element 102 can form a substantially single planar layer. For example, the resistor element 102 can have a thickness (in a direction perpendicular to an upper surface of the substrate 106 in FIG. 1B) of less than 100 nm, for example, between 50 nm and 75 nm. The conductors 104 can have a thickness greater than that of resistor element 102, for example, at least five times greater. For example, the conductor 104 thickness can be about 1 µm. The above dimensions are exemplary only, as dimensions for a particular dissipative device will depend on the selected materials as well as the desired application (e.g., desired resistance) for the dissipative device.

An input signal can be applied to the resistor element 102 via one of the conductors 104, and the resulting output signal can be transmitted via the other of the conductors 104. For example, FIGS. 2A-2B show plan and cross-sectional views of a dissipative device connected to ports for signal transmission to/from resistor element 102. A first port 108a (e.g., an input port) is coupled via electrical connection means 110a (e.g., wire) to heat sink/conductor 104a, while a second port 108b (e.g., an output is coupled via electrical connection means 110b to the heat sink/conductor 104b on the opposite side of resistor element 102. In microwave applications, ports 108a, 108b may be conventional microwave connectors, such as subminiature version A (SMA) connectors.

In one or more embodiments, the dissipative device 100 of FIGS. 1A-1B can be considered a single cell, and multiple cells can be combined together in series or in parallel. For example, FIGS. 3A-3B show a dissipative device 130 including a pair of dissipative cells arranged in series. Thus, device 130 includes a pair of resistor elements 102 with respective heat sink/conductors 104 on a common insulating substrate 106. Such dissipative cells can serve as building blocks for desired circuits, such as the attenuator circuit or as part of a directional coupler, as described in further detail below.

Figure 4B:
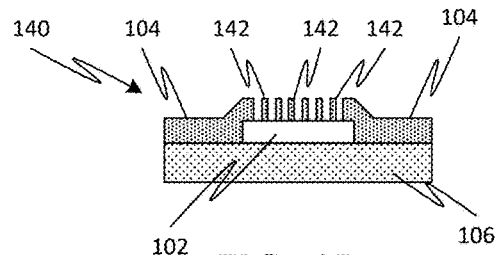

In some embodiments, additional heat-sink elements can be provided to supplement the heat dissipation and hot electron cooling functions of the heat-sink/conductors 104. For example, FIGS. 4A-4B show a dissipative device 140 that includes heat-sink islands 142 spaced from each other on an upper surface of resistor element 102. The heat-sink islands 142 can be formed of a same material (and at a same time) as that of the heat-sink/conductors 104. Alternatively, the heat-sink islands 142 can formed of a different material (and/or at a different time) from that of the heat-sink/conductors 104.

Figure 4C:
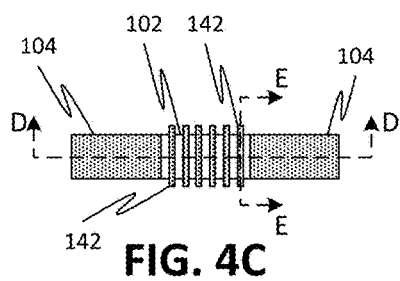
FIG. 4C is a plan view illustrating a dissipative device employing a first variation of heat sink islands, according to one or more embodiments of the disclosed subject matter.
Figure 4D:
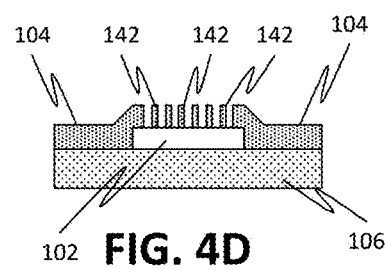
FIGS. 4D and 4E are cross-sectional views along respective lines D-D and E-E of the dissipative device illustrated in FIG. 4C.
Figure 4E:
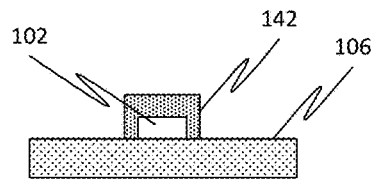
Figure 4F:
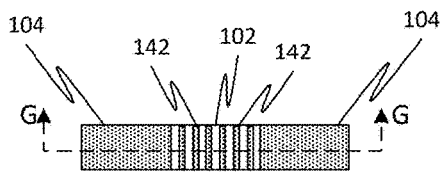
FIGS. 4F and 4G are plan and cross-sectional views, respectively, illustrating a dissipative device employing a second variation of heat sink islands, according to one or more embodiments of the disclosed subject matter.
Figure 4G:
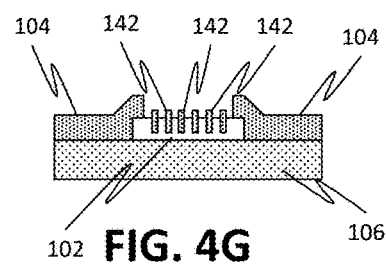

Because the heat-sink islands 142 are isolated from substrate 106, the primary mode of heat dissipation is through radiation to the environment, similar to heat fins. To improve heat dissipation, in some embodiments, the heat-sink islands 142 can be connected to the substrate 106 at lateral sides of the resistor element 102, as illustrated in FIGS. 4C-4E. In such a configuration, the resistor element 102 would be in contact on three sides with a heat-sink island 142, while the bottom surface of the resistor element 102 would be in contact with the substrate 106, as shown in FIG. 4E. Alternatively or additionally, the heat-sink islands 142 can be embedded within the upper surface of the resistor element 102 (e.g., in grooves in the upper surface) rather than on the upper surface, as illustrated in FIGS. 4F-4G.

Figure 5A:
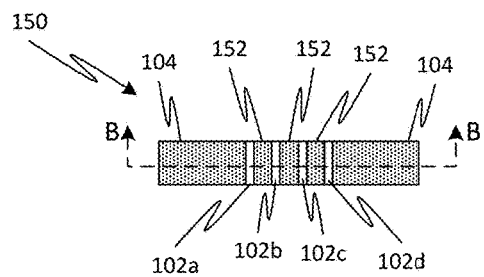
FIGS. 5A and 5B are plan and cross-sectional views, respectively, illustrating a dissipative device employing heat sink spacers between resistor sub-elements, according to one or more embodiments of the disclosed subject matter.
Figure 5B:
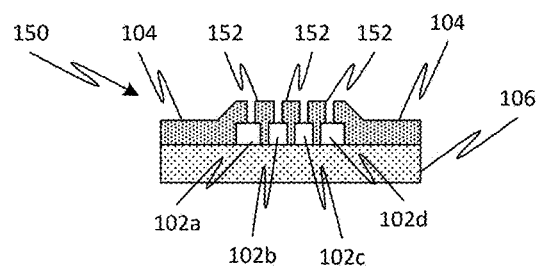

In some embodiments, the heat-sink islands can be extended through the thickness of the resistor element 102, thereby breaking up the resistor element 102 into multiple sub-elements. Such a configuration is illustrated in FIGS. 5A-5B, where dissipative device 150 has multiple resistor sub-elements 102a-102d arranged in series (together forming resistor element 102) and separated by conductive heat-sink spacers 152 that extend through the thickness of the resistor 102. Since the spacers 152 are in contact with the substrate 106 as well as the resistor sub-elements 102a-102d, improved efficiency with respect to heat dissipation and hot electron cooling can be achieved. The heat-sink spacers 152 can be formed of a same material (and at a same or different time) as that of the heat-sink/conductors 104. Alternatively, the heat-sink spacers 152 can formed of a different material (and at a different time) from that of the heat-sink/conductors 104.

Figure 10A:
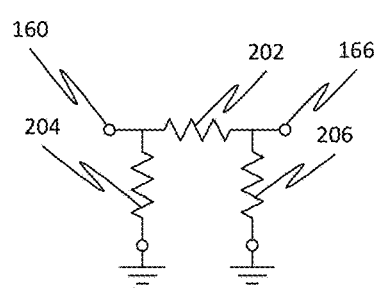
FIGS. 10A and 10B are schematic diagrams illustrating π-pad resistor configurations for a dissipative device operating as an attenuator using three and five resistors, respectively.
Figure 10B:
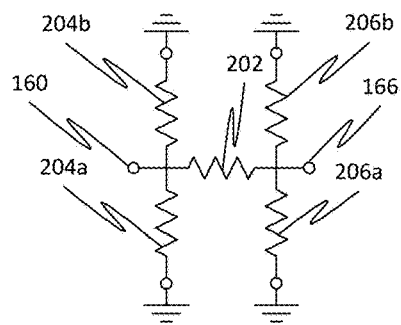

In embodiments, resistive elements of a dissipative device can be arranged to form an attenuator circuit, such as an attenuator circuit in a T-pad configuration using three resistors (asymmetric configuration, shown in FIG. 6A) or four resistors (symmetric configuration, shown in FIG. 6B), or an attenuator circuit in a π-pad configuration using three resistors (asymmetric configuration, shown in FIG. 10A) or five resistors (symmetric configuration, shown in FIG. 10B).

Figure 6A:
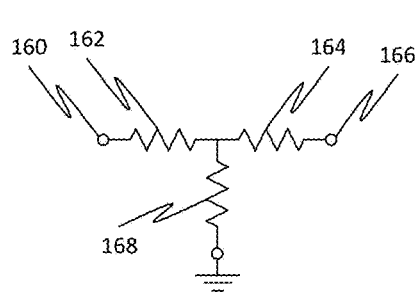
FIGS. 6A and 6B are schematic diagrams illustrating T-pad resistor configurations for a dissipative device operating as an attenuator using three and four resistors, respectively.

In the three resistor T-pad configuration illustrated in FIG. 6A, the attenuator circuit has an input 160 to first resistor element ($R_1$) 162, which is connected to second resistor element ($R_2$) 164 and third resistor element ($R_3$) 168. Output 166 from the attenuator circuit is at an end of second resistor element 164 opposite the first resistor element 162 connection, while an end of third resistor element 168 opposite the first resistor element 162 connection is connected to a ground plane. In the four resistor T-pad configuration illustrated in FIG. 6B, the attenuator circuit additionally has a fourth resistor element ($R_4$) 168b connected to the first resistor element 162 and also connected to ground, similar to the third resistor element 168a.

Figure 6B:
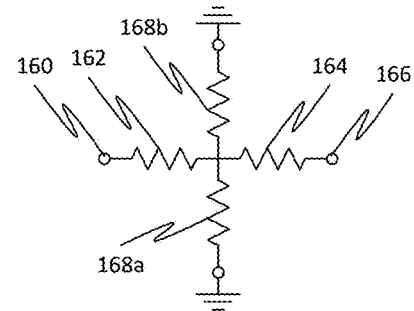

In the four resistor T-pad configuration of FIG. 6B, the attenuator can be designed for a desired dB attenuation, for example, with 50 Ohm impedance-matched ports. The resistances $R_1$, $R_2$, $R_3$, and $R_4$ for resistors 162, 164, 168a, and 168b, respectively, can be chosen based on the desired amount of power attenuation $K^2$, impedance matching to the characteristic impedance $Z_0$ of the input and output microwave lines, and symmetry. With these constraints, the values for the resistors are given by:

$$R_1 = R_2 = Z_0 \frac{K-1}{K+1} \text{ and} \tag{1}$$

$$R_3 = R_4 = Z_0 \frac{4K}{K^2-1}, \tag{2}$$

where $K=V_{in}/V_{out}$ is the ratio of the input voltage to the output voltage. For a 10 dB attenuator sub-stage ($K^2=10$) connected to a characteristic impedance of $Z_0=50\Omega$, the resulting resistance values are $R_1=R_2=26.0\Omega$ and $R_3=R_4=70.3\Omega$. Dimensions of the resistor elements forming the attenuator circuit can be tailored to provide the resulting resistance values based on the sheet resistance of the thin film forming the resistor elements.

FIGS. 7A-7D show plan and cross-sectional views of a dissipative device 170 configured as an attenuator circuit having a four resistor T-pad configuration. In particular, the dissipative device 170 is configured as a coplanar waveguide microwave attenuator, with a central conductor between a pair of ground planes 174. The central conductor is formed by heat-sink/conductors 172 connecting the first resistor element 162 and the second resistor element 164 along a central line. For example, the central conductor can have a width $w_c$ less than 1 mm, for example, approximately 700-800 μm. The central conductor can be separated from the ground planes 174 by a gap 176, which may have a width $w_g$ less than the conductor width $w_c$, for example, approximately 200-300 μm. The ratio of the width $w_c$ and the width $w_g$ can be chosen based on the desired characteristic impedance $Z_0$ of the coplanar waveguide and based on the relative permittivity of the material of the substrate 106. For example, for a relative permittivity of 3.9 for the substrate, $w_c$ can be set as 800 μm and $w_g$ can be set as 260 μm. Extending to the ground planes 174 from the central conductor between the first resistor element 162 and the second resistor element 164 are the third resistor element 168a and the fourth resistor element 168b.

Each of the resistor elements, the heat-sink/conductors 172, and the ground planes 174 are formed on a common insulating substrate 106. Note that the ground planes 174 may be formed of a same material (and at a same or different time) as that of heat-sink/conductors 172. Alternatively, the ground planes 174 may be formed of a different material (and at different time) from that of heat-sink/conductors 172. In any event, the ground planes 174 are designed to act as heat-sinks with respect to resistor elements 168a-168b in the same manner as conductors 172 act as heat-sinks with respect to resistor elements 162 and 164.

As noted above, the dimensions of the resistor elements (e.g., respective lengths $L_{R1}$, $L_{R2}$, $L_{R3}$, and $L_{R4}$) can be determined based on desired resistance values and the sheet resistance of the thin film forming the resistor elements. While physically larger resistors are thermally advantageous, the maximum size of the resistors can be limited by the microwave response. For a large resistor, its parasitic capacitance and inductance become important, and a lumped element model is not valid.

Figure 7A:
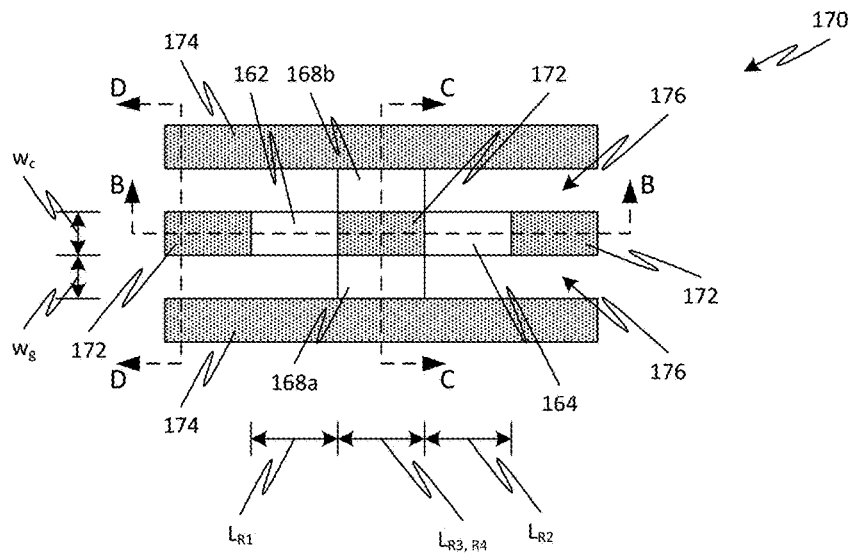
FIG. 7A is a plan view illustrating a dissipative device configured as coplanar waveguide attenuator using the T-pad resistor configuration, according to one or more embodiments of the disclosed subject matter.
Figure 7B:
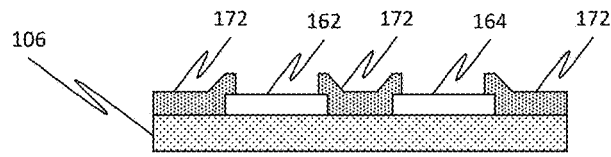
FIGS. 7B-7D are cross-sectional views, taken along respective lines B-B, C-C, and D-D, of the dissipative device illustrated in FIG. 7A.
Figure 7C:
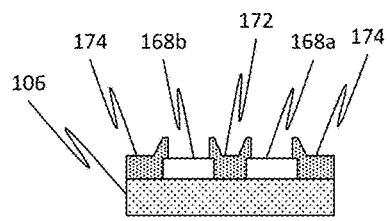
Figure 7D:
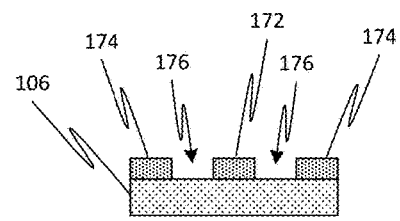

For example, the dissipative device of FIG. 7A can be constructed to provide 20 dB attenuation and such that, for input microwave power of less than 30 nW, a resulting noise temperature of the attenuator is less than 120 mK in an operating environment less than 20 mK. The dissipative device may also have a bandwidth (i.e., where deviation from desired attenuation is less than 3 dB over range of frequencies) from at least 1 GHz to 10 GHz, for example, from 0-15 GHz or higher. In such a configuration, the first and second resistor elements can have a length of, for example, 1235 μm, and the third and fourth resistor elements can have a length of, for example, 247 μm, with widths, $w_c$ equal to 800 μm and $w_g$ equal to 260 μm.

As noted above, the construction of the dissipative device allows conductors 172 and ground planes 174 to conduct heat generated in the resistor elements 162, 164, 168a, 168b to the substrate 106 (and on to the housing coupled to the substrate) and to cool hot-electrons generated by the resistor elements. At milli-kelvin temperatures, the transfer of heat between the electrons and phonons in a metal thin-film can be very poor. When electrical power is dissipated, it drives the electron temperature $T_e$ out of equilibrium with the phonon temperature $T_p$ and makes the electron temperature hot (i.e., $T_e \gg T_p$). This electron effect can be modeled using:

$$P_{e\text{-}ph} = V_m \Sigma (T_e^5 - T_p^5) \qquad (3)$$

where $p_{e\text{-}ph}$ is the net rate at which heat is transferred from the electrons to the phonons, $V_m$ is the volume of the metal, and $\Sigma$ is a material-dependent parameter of electron-phonon coupling. For example, $\Sigma_{Ag} = 10^8$ W m$^{-3}$ K$^{-5}$ for conductors 172 and ground planes 174 formed of Ag, and $\Sigma_{NiCr} = 2.4 \times 10^9$ W m$^{-3}$ K$^{-5}$ for resistor elements formed of NiCr.

The transfer of heat from a thin film to a substrate can also be limited by phonon scattering at the interface. The effect of Kapitza boundary resistance can be modeled using:

$$P_{ph\text{-}ph} = G_K(T) \Delta T \qquad (4)$$

where $\Delta T$ is the difference in phonon temperatures between the two materials, $G_K(T) = A_K B T^3$ is the Kapitza boundary conductance, $A_K$ is the cross-sectional interface area, and $B_{Ag} = 1200$ W m$^{-2}$ K$^{-4}$ is set for the Ag-quartz interface and $B_{NiCr} = 950$ W m$^{-2}$ K$^{-4}$ is set for the NiCr-quartz interface.

Figure 8:
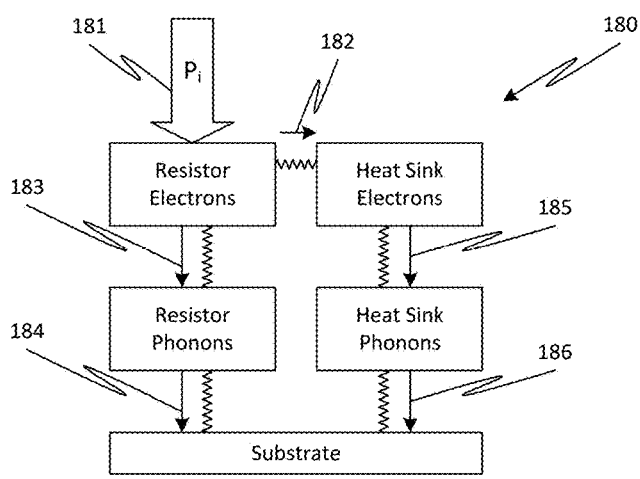
FIG. 8 is schematic diagram of a thermal model for simulation of a dissipative device configured as a coplanar waveguide attenuator, according to one or more embodiments of the disclosed subject matter.

FIG. 8 shows a simplified schematic 180 of the heat flow in one of the resistor elements in the attenuator 170. Heat from input power $P_i$ 181 is delivered to the resistor element electrons and flows to the phonons of the resistor element by electron-phonon) coupling ($P_{e\text{-}ph}^{(Res)}$) 183 or to the conductor element electrons by electron conduction ($P_{e\text{-}e}^{(leads)}$) 182. Heat that flows into the conductor leads can either flow into the phonon bath of the conductor (e.g via $P_{e\text{-}ph}^{(Cond)}$) or diffuse laterally to the edges of the conductor material, which can be assumed to be at the base temperature. For heat flow via phonon conduction, the temperature difference between phonons in the metal and the substrate due to Kapitza boundary resistance (e.g., $P_{ph\text{-}ph}^{(Res)}$ 184 and $P_{ph\text{-}ph}^{(Cond)}$ 186) can be calculated, as described in detail in the underlying '521 and '191 provisional applications incorporated by reference herein. Unlike other dissipative device designs, embodiments of the present disclosure take into account the self-heating issues associated with electron-phonon coupling and Kapitza boundary resistance in order to minimize, or at least reduce, thermal noise when operating the dissipative device at ultra-low temperatures.

Figure 9:
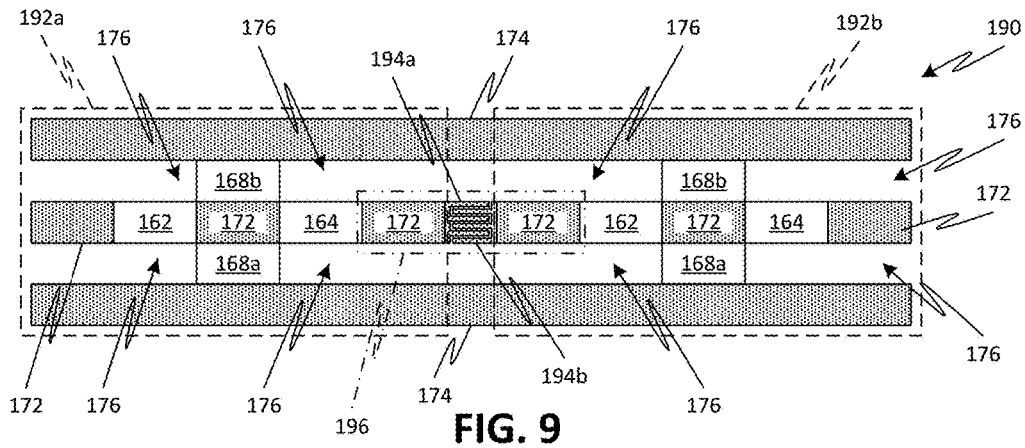
FIG. 9 is a plan view illustrating a coplanar waveguide attenuator using multiple attenuator cells and capacitive coupling between cells, according to one or more embodiments of the disclosed subject matter.

In embodiments, a dissipative device functioning as an attenuator can be formed of multiple individual attenuator cells, for example, as illustrated by attenuator 190 in FIG. 9. In particular, attenuator 190 comprises a pair (or more) of identical attenuator cells 192a, 192b, each formed in a symmetric T-pad configuration, as described above with FIGS. 7A-7D. In some embodiments, the attenuator cells 192a, 192b are directly coupled together via adjacent heat-sink/conductors 172 in coupling region 196 (not shown). Optionally, coupling region 196 can be provided with capacitors (e.g., interdigitated comb fingers 194a, 194b) can couple input/output between adjacent cells. While not wishing to be bound to any particular theory, it is believed that the capacitors may block thermal electromotive force (emf). However, attenuator devices employing multiple cells are not required to include such capacitors to operate effectively. For example, interdigitated capacitor 194a, 194b can have fingers of 5 μm width and 800 μm length, with a gap between fingers of 5 μm. Although full heat sinks 172 are shown between resistor elements and the capacitor 194a, 194b, it is also possible that the length of the heat sinks 172 can be reduced or eliminated in coupling region 196, for example, by combining with capacitor 194a, 194b.

In the three resistor π-pad configuration illustrated in FIG. 10A, the attenuator circuit has an input 160 to first resistor element ($R_1$) 202, which is connected to second resistor element ($R_2$) 204 at one end and to third resistor element ($R_3$) 206 at an opposite end. Output 166 from the attenuator circuit is at an end of the first resistor element 202, while ends of the second resistor element 204 and the third resistor element 206 opposite the first resistor element 202 connections are connected to a ground plane. In the four resistor T-pad configuration illustrated in FIG. 10B, the attenuator circuit additionally has a fourth resistor element ($R_4$) 204b connected to the first resistor element 202 and also connected to ground, similar to the second resistor element 204a. A fifth resistor element ($R_5$) 206b is also connected to the first resistor element 202 and also connected to ground, similar to the third resistor element 206a.

Figure 11:
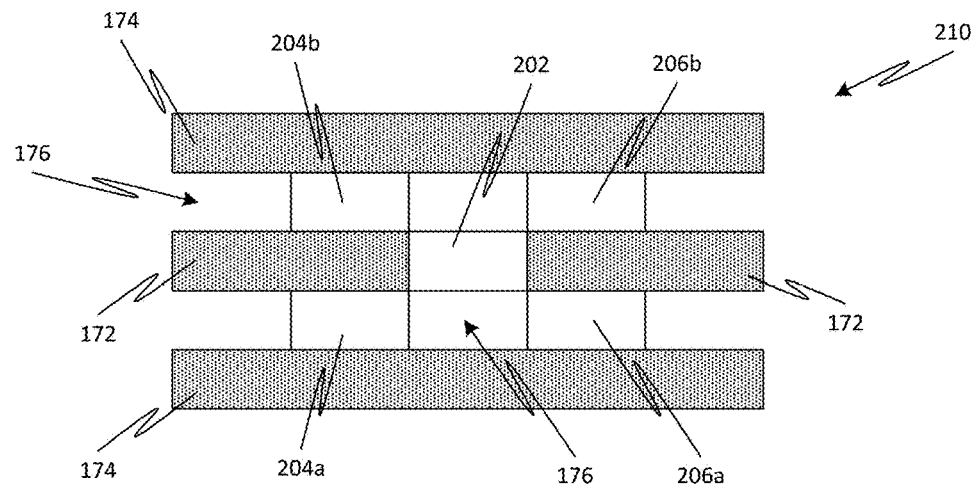
FIG. 11 is a plan view illustrating a dissipative device configured as a coplanar waveguide attenuator using the π-pad resistor configuration, according to one or more embodiments of the disclosed subject matter.
Figure 12:
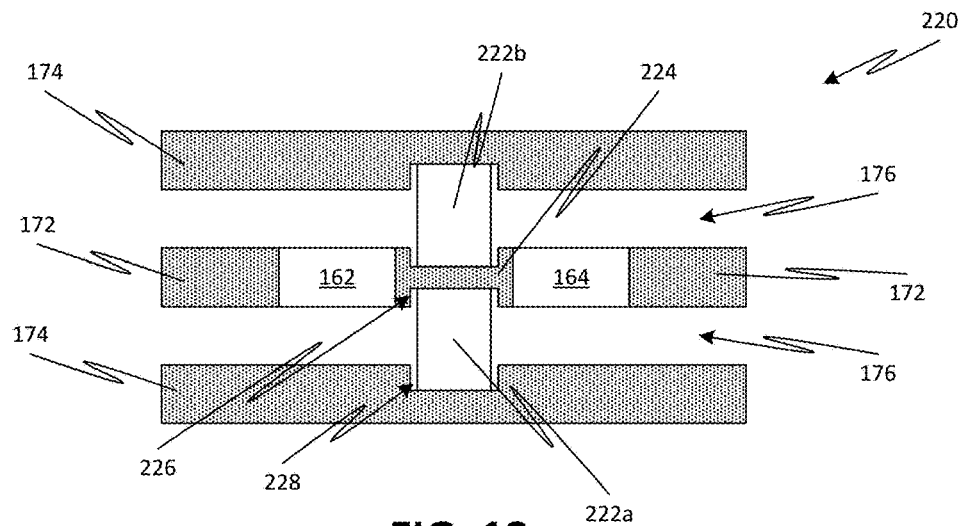
FIG. 12 is a plan view illustrating a first variation of a dissipative device configured as a coplanar waveguide attenuator, according to one or more embodiments of the disclosed subject matter.

FIG. 11 shows a plan view of a dissipative device 210 configured as an attenuator circuit having a five resistor π-pad configuration. In particular, the dissipative device 210 is configured as a coplanar waveguide microwave attenuator, with a central conductor between a pair of ground planes 174. The central conductor is formed by heat-sink/conductors 172 connecting to the first resistor element 202 along a central line. Extending to the ground planes 174 from the central conductor are the second and fourth resistor elements 204a, 204b and the third and fifth resistor elements 206a, 206b. The arrangement and material selection of components of the π-pad attenuator is otherwise similar to that described above with respect to the T-pad attenuator, FIG. 12 shows a first variation of the T-pad attenuator configuration of FIG. 7A. In FIG. 12, dissipative device 220 is substantially similar to that of FIG. 7A, but the planar area of the resistor elements has been increased. To accommodate the increased resistor element size, in particular, that of third resistor element 222a and fourth resistor element 222b, recesses are formed in central conductor 224 and in the ground planes 174. Gaps 226 may be formed between the central conductor 224 and the sidewalls of the respective resistor element to prevent shorting (which would otherwise reduce the effective width of the resistor element). Gaps 228 may also be formed between ground planes 174 and the sidewalls of the respective resistor element to prevent shorting. Gaps 226 and/or 228 may be on the order of 10 μm, for example.

Figure 13:
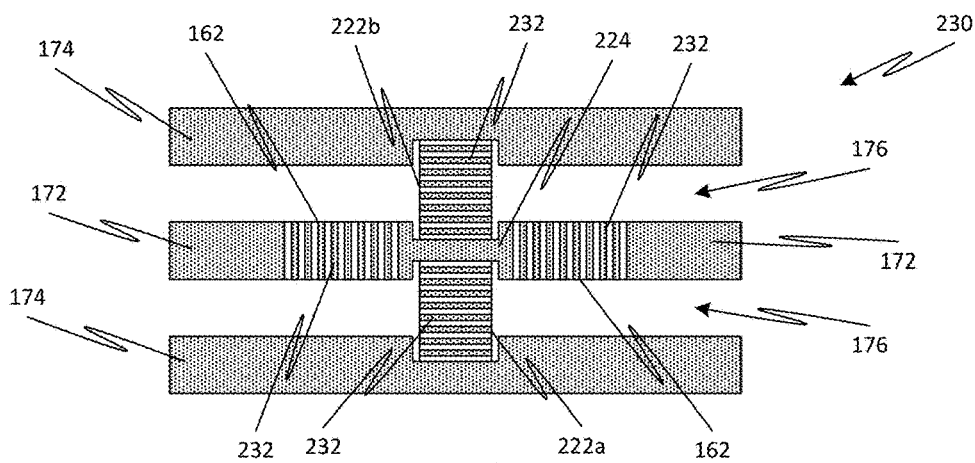
FIG. 13 is a plan view illustrating a second variation of a dissipative device configured as a coplanar waveguide attenuator with heat sink islands or heat sink spacers, according to one or more embodiments of the disclosed subject matter.

FIG. 13 shows a second variation of the T-pad attenuator configuration of FIG. 7A, and incorporating features of FIGS. 4A-4G. In FIG. 13, dissipative device 230 is substantially similar to that of FIG. 12, but heat-sink islands 232 have been formed on an upper surface of the resistor elements. Alternatively, elements 232 may be heat-sink spacers similar to those illustrated in FIG. 5A. In such a configuration, the spacers 232 are formed between the sub-elements forming the individual resistor elements.

Figure 14:
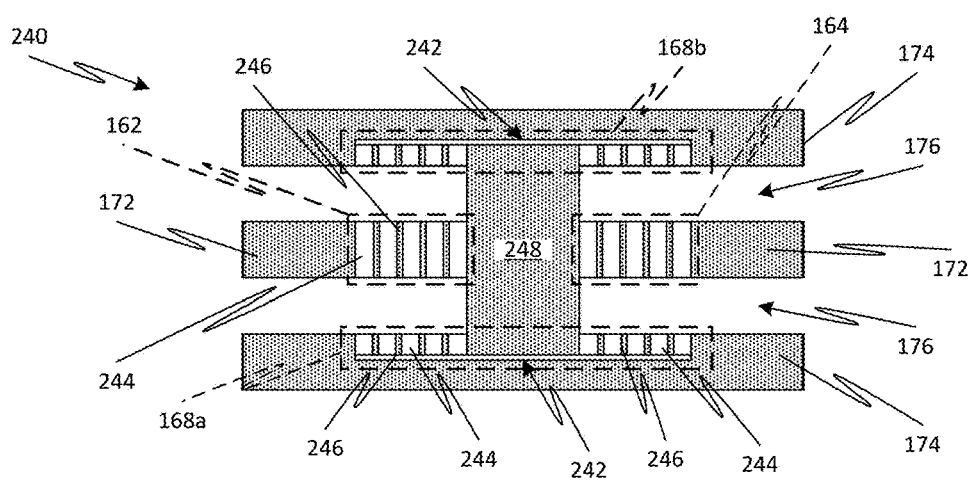
FIG. 14 is a plan view illustrating a third variation of a dissipative device configured as a coplanar waveguide attenuator with heat sink islands or heat sink spacers, according to one or more embodiments of the disclosed subject matter.

FIG. 14 shows a third variation of the T-pad attenuator configuration of FIG. 7A, and incorporating features of FIG. 5A. In FIG. 14, dissipative device 240 includes resistor elements 162, 164, 168a, 168b formed of individual sub-elements 244 separated from each other by a heat-sink spacer 246. In addition, the third and fourth resistor elements 168a, 168b have been moved to a region adjacent the ground plane 174 (rather than crossing gap 176 as in FIG. 7A). Electrical connection to the third and fourth resistor elements 168a, 168b is made using a larger central heat-sink/conductor 248, which crosses gaps 176. Gaps 242 may be formed between the central conductor 248 and the ground planes to prevent shorting. Gaps 242 may also be formed between ground planes 174 and the sidewalls of the resistor sub-elements 244 (and spacers 246) of the third and fourth resistor elements 168a, 168b to prevent shorting (which would otherwise reduce the effective width of the resistor element). Gaps 226 and/or 228 may be on the order of 10 μm, for example.

Figure 15A:
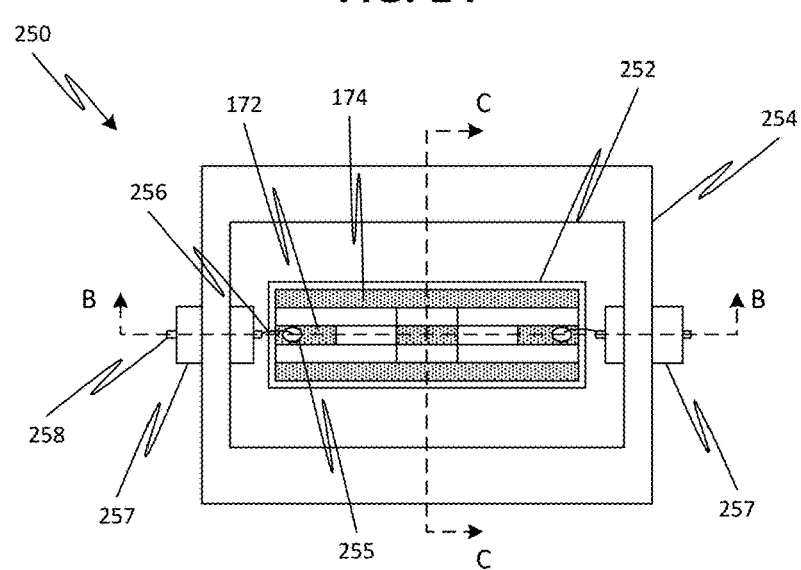
FIG. 15A is a plan view illustrating a dissipative device chip mounted in a housing, according to one or more embodiments of the disclosed subject matter.
Figure 15B:
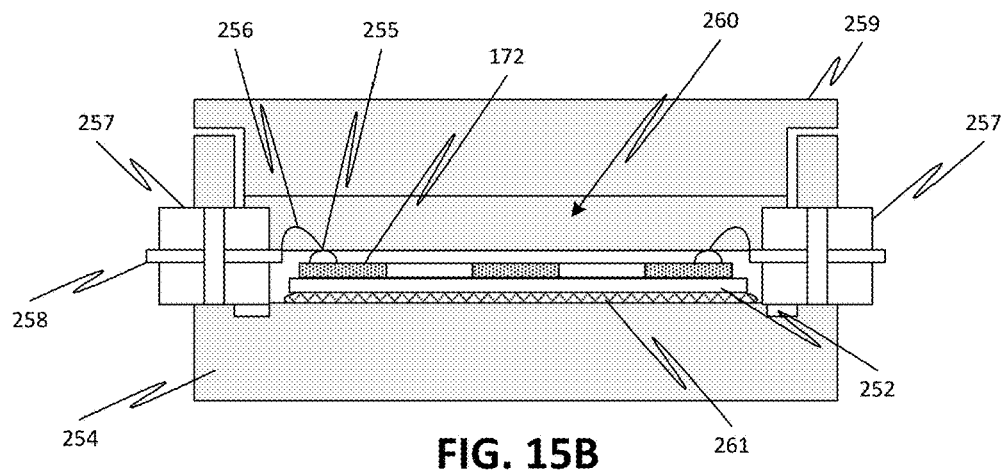
FIGS. 15B and 15C are cross-sectional views, taken along respective lines B-B and C-C of the housing with mounted dissipative device chip illustrated in FIG. 15A.
Figure 15C:
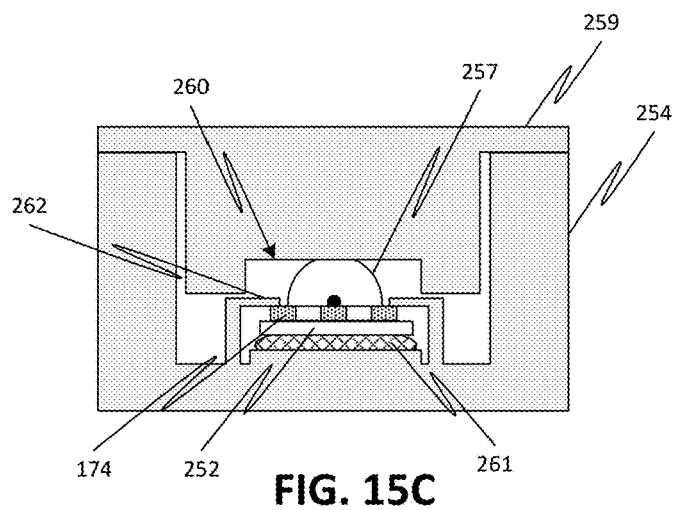

Alternatively, elements 246 in FIG. 14 may be heat-sink islands, similar to those illustrated in FIGS. 4A-4G. In such a configuration, the islands 246 would be formed on upper surfaces of the resistor elements 162, 164, 168a, 168b without any division of the resistor elements into sub-elements, In embodiments, the dissipative device can be disposed within a conductive housing (thermally and/or electrically) for subsequent connection to and use with other system components. For example, a dissipative device can be formed as a chip 252 (e.g., an attenuator chip in T-pad configuration, such as illustrated in FIG. 7A) and disposed in a housing 250, as illustrated in FIGS. 15A-15C. The housing can have a top half 259 and a bottom half 254, with the attenuator chip 252 enclosed therebetween. The housing can have ports, for example, ports 257, for connecting input and output signals to the attenuator chip. Although two ports are shown in FIG. 15A, additional ports are also possible according to one or more contemplated embodiments. For example, ports 257 can be standard microwave SMA (sub-miniature version A) connectors. The SMA connectors 257 can have conductors 258 directly by connection means 256 (e.g., wire) on the center connector 172 of the chip 252, for example, via wire bonding or soldering. The housing top half 259 can be provided with a channel 260 to avoid contacting an upper surface of attenuator chip 252 and/or connection means 256, which may otherwise cause shorting.

Grounding may be needed to achieve microwave attenuation with broadband. Thus, the housing 254, 259 can be held at ground and can be connected to the respective ground planes 174 of the chip 252, for example, via brackets 262. Alternatively or additionally, conductive connections between the ground planes 174 and the housing can be made via a conductive adhesive, a conductive paste, or a conductive epoxy, such as a silver paste or silver epoxy. A conductive mounting 261 can also be applied to the back of the chip 252 facing the housing 254 to improve thermal contact between the chip substrate and the housing. For example, the conductive mounting 261 can be a conductive adhesive, a conductive paste, or a conductive epoxy, such as a silver paste or silver epoxy. Other types of conductive mountings are also possible, such as a paste or epoxy comprising Au, Cu, or another noble metal.

Similar to the considerations for the material of the heat-sink/conductors, the housing 250 may be formed of a material that offers relatively high thermal conductivity but does not become superconductive at ultra-low temperatures. For example, the housing 250 can be formed of Ag or Cu.

Although FIGS. 15A-15C show the housing 250 constructed in two pieces, embodiments of the disclosed subject matter are not limited thereto. Rather, more than two pieces for the housing can be used according to one or more contemplated embodiments. For example, the housing can be formed in three pieces, with the bottom part 254 of FIGS. 15A-15C separated into two pieces. The attenuator chip 252 can then be held between the separate pieces forming the bottom part 254. The conductive mounting can be provided between the ground pads on the chip 252 and the upper box piece 259, as well as between the back of the chip 252 and the separate pieces of the bottom part 254. By using screws, bolts, rivets, or other fastening means to tighten together the separate pieces of the housing bottom part 254, the resulting pressure on the chip 252 can offer an improved thermal connection between the chip 252 and the housing.

Figure 16:
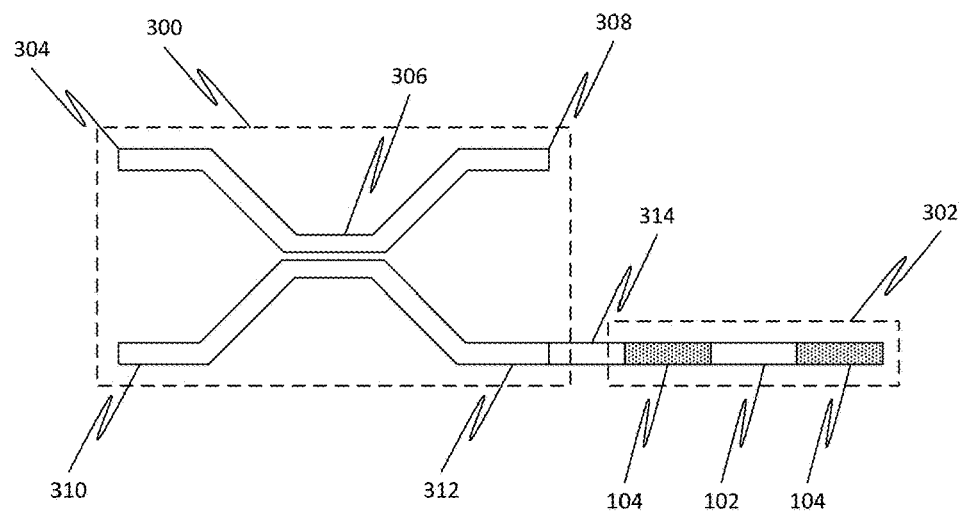
FIG. 16 is a plan view illustrating a dissipative device configured as resistor for a directional coupler, according to one or more embodiments of the disclosed subject matter.

In embodiments, resistive elements of a dissipative device can be used with a directional coupler, for example, as illustrated in FIG. 16. The directional coupler 300 can include a first waveguide with an input port 304 at one end and a through port 308 at an opposite end. The directional coupler 300 can also include a second waveguide with a coupled port 310 at one end and an isolated or terminating port 312 at an opposite end. An evanescent coupling portion 306 between the ports allows transfer of energy between the two waveguides. A dissipative device 302, configured as a resistor (e.g., a 50-ohm resistor), is connected to the terminating port 312.

FIG. 17A illustrates a generalized setup for use of a dissipative device in a cryogenic application. A cryogenic system 320, for example, a dilution refrigerator, has multiple thermal stages of decreasing temperature. For example, a first stage 322 may be a plate at 3 K, a second stage 324 may be a still plate at 1 K, a third stage 326 may be a cold plate at 0.1 K, and a final stage 328 may be a mixing chamber (e.g., where $^3$He and $^4$He are mixed to achieve ultra-low temperatures, for example, less than 20 mK). An input signal 332 can be provided to a configuration 330 including the dissipative device in thermal contact with the mixing chamber 328. Although illustrated as internal to the mixing chamber 328, the configuration is not actually disposed within the mixing chamber. Rather, it is disposed on a thermally conductive holder (e.g., a Cu pad) that is thermally coupled to the mixing chamber 328, such that the temperature thereof is conducted to the holder and components of the configuration (e.g., a dissipative device, a directional coupler, a qubit, a cavity system, etc.). The resulting output signal 334 can be communicated from the configuration 330 to an exterior of the cryogenic system 320 for subsequent use or detection.

For example, as shown in FIG. 17B, the configuration 330 can employ a dissipative device 340 operating as an attenuator for cooling the input signal 332. The cooled signal can then be applied to device 342, which can be a qubit, a cavity system of a quantum superconducting circuit, and/or any other cryogenic device susceptible to thermal noise. The resulting output 334 can then be communicated from device 342 to an exterior of the cryogenic system 320.

Similar to the attenuator setup of FIG. 17B, a directional coupler 300 with dissipative device 302, can be used to cool down input signals 332 for cryogenic microwave applications, as illustrated in FIG. 17C. The input signal 332 which is hot is applied to the coupled port of the directional coupler 302. The input signal is coupled to the through port of the directional coupler 300, which is connected to device 342 (e.g., a qubit, a cavity system, or other cryogenic device). The input port of the directional coupler 300 is not used and is therefore cold, while the terminating port of the directional coupler 300 is connected to dissipative device 302 in order to cool down the hot signal. Directional couplers can also be used for monitoring, source leveling, signal sampling, single injection, or the separation of direct and reflected waves in measurement.

Thermal photons from the environment can cause qubit dephasing, and thus more average number of thermal photons makes the dephasing time of a qubit shorter. When an attenuator is heated up by its dissipated power, it will generate more thermal photons if the thermalization design is not ideal. Therefore, dephasing time of the qubit is related with the effective noise temperature of the attenuator, and can be used to measure the attenuator self-heating. FIG. 18 illustrates a setup used for testing thermalization design of an attenuator (e.g., according to the configuration of FIG. 12) using a qubit.

The effective noise temperature of the attenuators at milli-kelvin temperatures was assessed using a Leiden Cryogenics CF-450 dilution refrigerator by measuring the dephasing rate of a 3D transmon qubit 430. At a first stage 404, a cable 406 (e.g., CuNi) communicates an input signal 402 through an outer vacuum can at ~300K to a second stage 410, e.g., a 3 K plate. A commercial off-the-shelf (COTS) 20 dB attenuator 408 was mounted on the 3 K plate on the input line 402. Another cable 414 (e.g., CuNi) communicates the attenuated input signal from the second stage 410 through a third stage 412 (e.g., a still plate at ~1 K) to a fourth stage 418 (e.g., a cold plate at ~0.1 K). A dissipative device configured as a 30 dB attenuator (e.g., according to the setup disclosed with respect to FIG. 12 or elsewhere herein) is attached to the cold plate 418.

Another cable 422 (e.g., Nb) communicates the further attenuated input signal from the fourth stage 418 to a fifth stage 420 (e.g., mixing chamber at ultra-low temperatures). In particular, the cable 422 transmits the signal to a DC block 424, followed by another dissipative device configured as a 20 dB attenuator (e.g., according to the setup disclosed with respect to FIG. 12 or elsewhere herein) attached to the mixing chamber 420. The further attenuated signal is then communicated to a low-pass filter 428 (e.g., 12 GHz) before being transmitted to the input port of qubit/cavity device 430 enclosed by a pair of mu-metal cylindrical shields 432, all of which were mounted on the mixing chamber 420.

The output port of the qubit/cavity device 430 was connected to another low-pass filter 434 (e.g., 12 GHz) and three microwave isolators 436 mounted on the mixing chamber 420. After the final isolator 436, the signal was transmitted through the cold plate stage 418 by cable 438 (e.g., Nb) and through still plate stage 412 by cable 440 (e.g., CuNi) to the 3 K plate stage 410, where it is amplified by amplifier 442 (e.g., a low-noise high-electron-mobility-transistor (HEMT) amplifier). The amplified output signal 446 can then be transmitted external to the refrigerator by another cable 444 (e.g., CuNi). Each of the cables connecting components between different stages can be microwave coax cables.

For qubit/cavity device 430, the three-dimensional superconducting aluminum cavity has a $TE_{101}$ fundamental mode at $f_c = \omega_c/2\pi = 7.924$ GHz and contained a fixed frequency transmon qubit. To excite and measure the qubit, the input and output lines were connected to two SMA launchers in the side of the cavity. The effective temperature $T_r$ of the cavity photons is determined by the noise on the cavity input and output ports, weighted by coupling factor $1/Q_{in}$ and $1/Q_{out}$, respectively. Since the goal was to measure the effective noise temperature $T_n$ of the signals from the last attenuator on the input line, the coupling of the cavity to the input port was designed to be much larger than the coupling to the output port ($Q_{in}=3700 \ll Q_{out} \cong 10^5$). In this limit, the noise from the input line dominates and $T_r \cong T_n$.

The qubit was fabricated on a sapphire substrate and comprised a single Al/AlOx/Al Josephson junction shunted by two large aluminum (Al) pads which reduced its charging energy to $E_C/h=190$ MHz and provided coupling to the $TE_{101}$ fundamental mode of the cavity. The transverse coupling between the cavity and qubit produces a shift of $2\chi$ in the qubit transition frequency for each additional photon stored in the cavity. Consequently, the qubit dephases if the total number N of photons fluctuates due to thermally generated photons n. The qubit-cavity system can be probed at the N=0 qubit frequency, in the limit of small photon number (n<<1), weak damping (i.e. $\kappa \ll \omega_c$ where $\kappa$ is the cavity decay rate), weak coupling (i.e. $\chi \ll \omega_c$), and strong dispersion (i.e. $|\chi| > \kappa > \gamma$, where $\gamma \cong 0.4$ MHz is the qubit relaxation rate). In this limit, if the dephasing of the qubit is dominated by thermal photons and other dephasing sources can be neglected, the dephasing rate for the qubit reduces to simply:

$$\Gamma_\varphi = \kappa \bar{n}_{th}. \qquad (5)$$

The cavity decay rate $\kappa = (8.6 \pm 0.8)$ $\mu s^{-1}$ was extracted from the measured resonance width of the dressed cavity and $\bar{n}_{th}$ is the average number of thermal photons stored in the cavity.

Figure 19A:
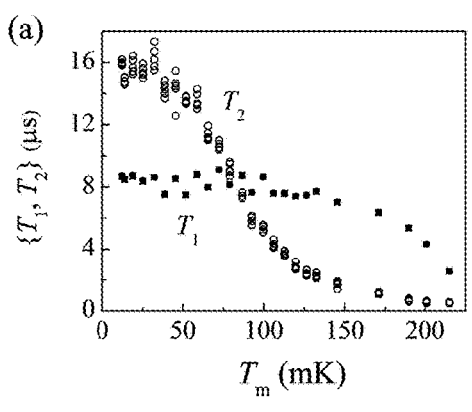
FIG. 19A is a graph of measured qubit relaxation time $T_1$ and spin-echo coherence time $T_2$ versus base temperature of the mixing chamber of FIG. 18.
Figure 19B:
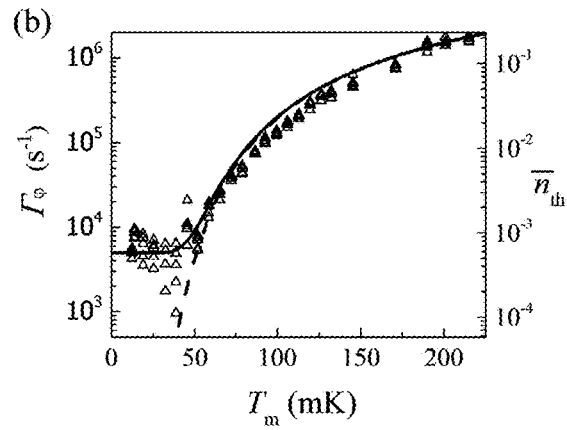
FIG. 19B is a graph of extracted dephasing rate and corresponding average number of thermal photons for the attenuator setup of FIG. 18 versus base temperature of the mixing chamber.

The extracted dephasing rate $\Gamma_\varphi$ (triangles) as a function of mixing chamber temperature $T_m$ is shown in FIG. 19B. For comparison, the dashed curve in FIG. 19B shows $\Gamma_\varphi$ calculated from Eq. (5) using Bose-Einstein statistics for $\bar{n}_{th} = [\exp(hf_c/k_B T_r) - 1]^{-1}$ and assuming that the effective temperature of the cavity $T_r$ is in equilibrium with the mixing chamber temperature ($T_r = T_m$). For $T_m < 40$ mK, the dephasing rate saturates at $\Gamma_\varphi^{min} = (5\pm2) \times 10^3$ s$^{-1}$ (FIG. 19B, solid curve). Using Eq. (5), this rate of dephasing corresponds to $\bar{n}_{th} < 8 \times 10^{-4}$ photons and $T_r < 53$ mK which is a factor of two smaller in temperature than obtained using COTS attenuators at milli-kelvin temperatures.

From measurements of the qubit relaxation time $T_1$ and spin-echo coherence time $T_2$, the qubit dephasing rate using $\Gamma_\varphi = T_2^{-1} - (2T_1)^{-1}$ was extracted. The cavity readout pulses were 4 $\mu s$ long and repeated every 400 $\mu s$. For placing the qubit in its excited state for the relaxation measurement, a $\pi$-pulse with a 100 ns duration was used. FIG. 19A shows the measured $T_1$ (squares) and $T_2$ (circles) at different mixing chamber temperatures $T_m$. For $T_m < 130$ mK, $T_1$ was roughly constant; the scatter in $T_1$ below 100 mK was a result of two separate cooldowns. Above 130 mK, thermal activation of quasiparticles results in a rapid decrease in $T_1$ as $T_m$ increases. On the other hand, $T_2$ begins to noticeably decrease above 50 mK due to photons populating the cavity.

Figure 20A:
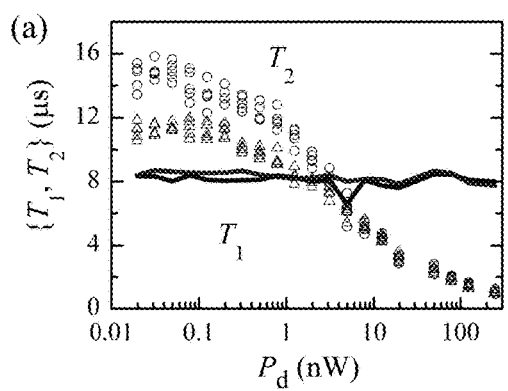
FIG. 20A is a graph of measured qubit relaxation time $T_1$ and spin-echo coherence time $T_2$ versus dissipated power through a 20 dB attenuator on the mixing chamber of FIG. 18 at 14 mK and 72 mK.

In addition, the dephasing was measured when the temperature of the attenuator was increased above $T_m$ by applying a steady tone at f=1 GHz (far detuned from the qubit and cavity frequencies) to the input line. FIG. 20A shows the measured $T_1$ and $T_2$ versus power $P_d$ dissipated in the 20 dB attenuator (on the mixing chamber) with the temperature of the refrigerator at $T_m=14$ mK (triangles) and $T_m=72$ mK (circles). Note that at the maximum dissipated power $P_d=250$ nW, the mixing chamber temperature increased from 14 mK to 40 mK and from 72 mK to 83 mK, respectively. In addition to the steady heating tone, the qubit probing tone dissipated 10 pW during the 100 ns qubit $\pi$-pulse in the final 20 dB attenuator, and the cavity readout tone dissipated 0.5 nW during the 4 $\mu s$ readout pulse.

Figure 20B:
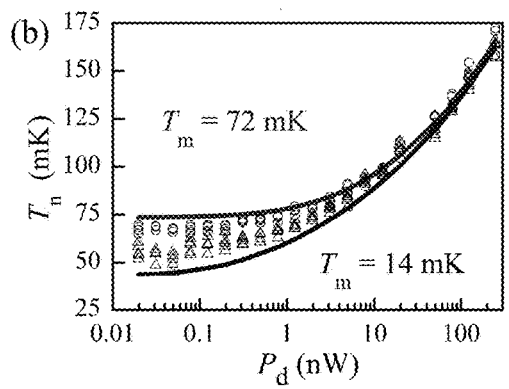
FIG. 20B is a graph of effective noise temperature versus dissipated power in the 20 dB attenuator on the mixing chamber of FIG. 18 at 14 mK and 72 mK.

FIG. 20B shows the effective noise temperature $T_n$ calculated from the dephasing rate $\Gamma_\varphi$ extracted from $T_1$ and $T_2$. Above approximately $P_d=1$ nW, the attenuator begins to heat up with a power dependence $T_n \propto P_d^{1/5.4}$, a power law which suggests the cooling of the electrons in the attenuator is limited by the electron-phonon coupling.

A setup similar to that of FIG. 18 was used to assess the output noise temperature using attenuator cells constructed according to the setup of FIG. 12 (e.g., as shown in FIG. 21A, referred to as $V_2$ in the graphs) and using attenuator cells according to the setup of FIG. 14 (e.g., as shown in FIG. 21B, referred to as $V_3$ in the graphs). FIG. 22 shows a graph of simulation results of the output noise temperature as a function of base temperature (i.e., mixing chamber temperature $T_m$) for attenuator $V_2$ and $V_3$, and with input noise temperatures $T_{in}$=20 mK or 100 mK. FIG. 23 shows a graph of simulation results of the output noise temperature as a function of input power for attenuator $V_2$ and $V_3$, and with input noise temperatures $T_{in}$=20 mK or 100 mK. As is apparent from the graphs, the attenuator configuration of $V_3$ (FIG. 21B) may exhibit improved thermal noise performance as compared to $V_2$ (FIG. 21A), when the noise temperature is smaller (as in FIG. 22) or when a steady heating power is applied (as in FIG. 23).

Figure 24:
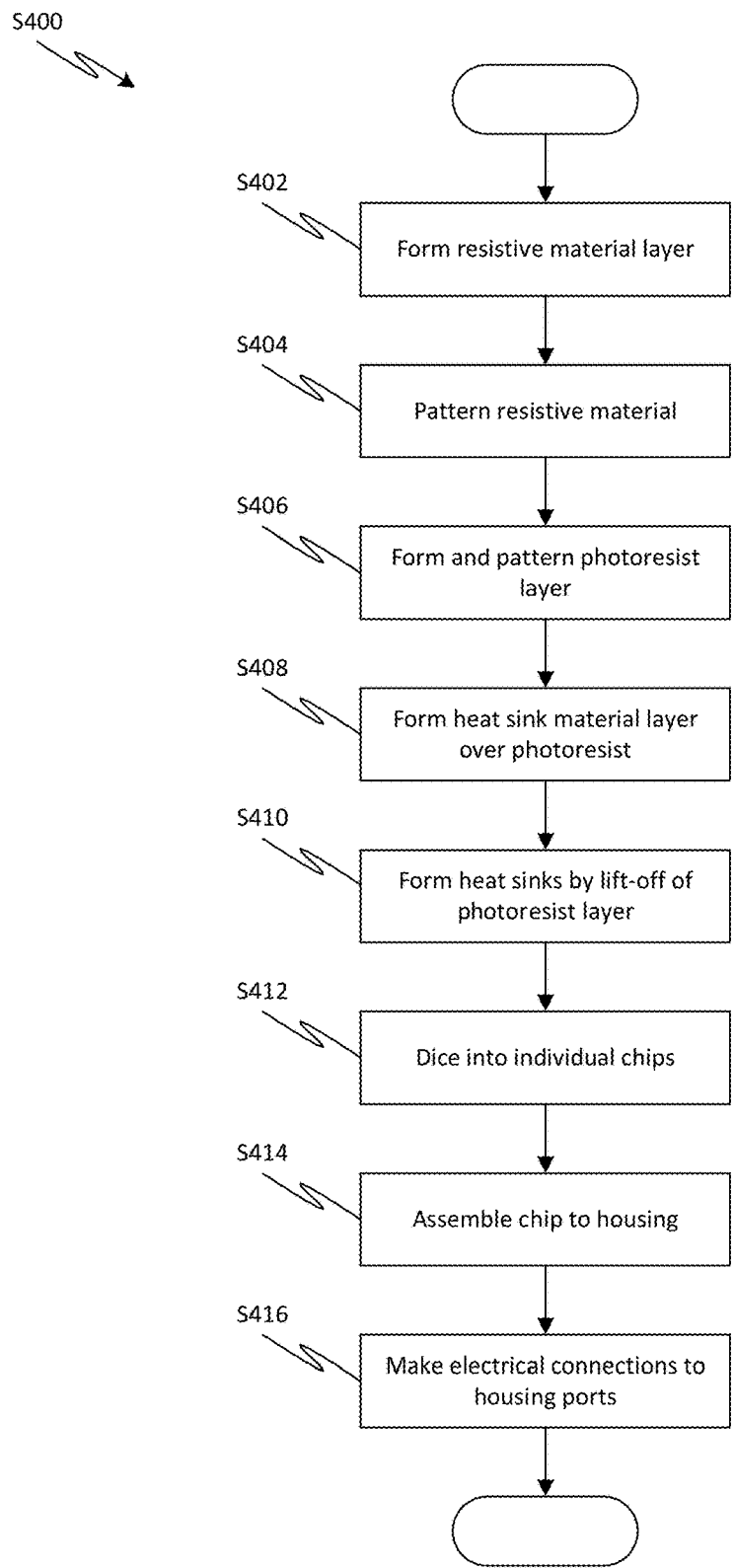
FIG. 24 is a simplified process flow diagram for fabricating a dissipative device, according to one or more embodiments of the disclosed subject matter.
Figure 25A:
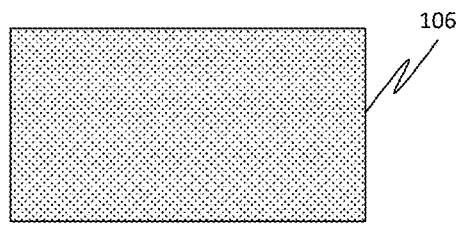
FIGS. 25A-25G are plan views of various process steps in fabricating a dissipative device as a coplanar waveguide attenuator, according to one or more embodiments of the disclosed subject matter.
Figure 26A:
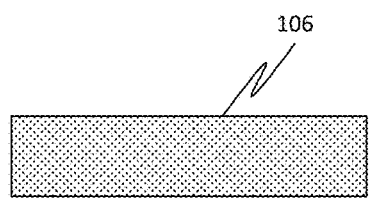
FIGS. 26A-26G are cross-sectional views corresponding to FIGS. 25A-25G, respectively.
Figure 25B:
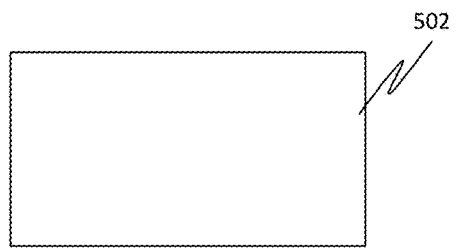
Figure 26B:
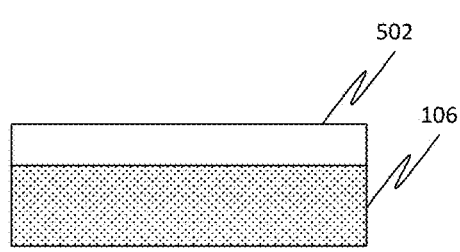

FIG. 24 illustrates a process flow diagram S400 for fabrication of the dissipative devices disclosed herein, as well as systems including such dissipative devices. At S402, a first material layer 502 for forming the resistor elements can be formed over an upper surface of the substrate 106. The bare substrate 106 is illustrated in FIGS. 25A, 26A, while the formed first material layer 502 is illustrated in FIGS. 25B, 26B. The first material layer 502 may be formed by, for example, sputtering and may comprise one of the materials for the resistor element 102 described in detail above.

Figure 25C:
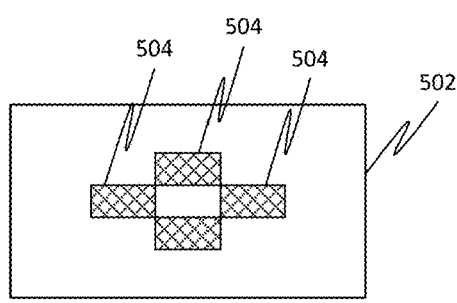
Figure 26C:
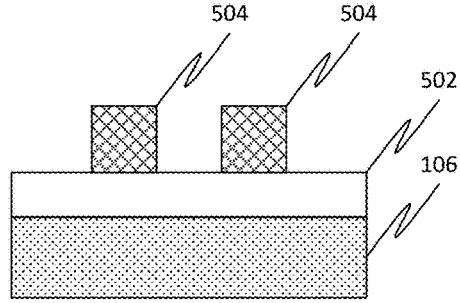
Figure 25D:
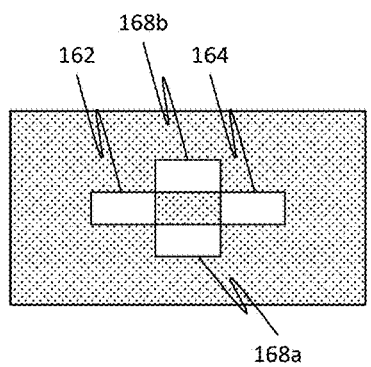
Figure 26D:
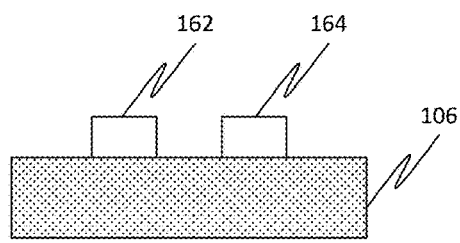

Returning to FIG. 24, the process can then proceed to S404, where the first material layer 502 is patterned to form the resistor elements. For example, a photoresist can be deposited over the first material layer 502 and patterned (e.g., via photolithography) to form mask 504, as illustrated in FIGS. 25C, 26C. The mask 504 can protect the underlying first material layer 502 during an etching step (e.g., a wet chemical etch), which removes the unprotected first material layer 502 and forms resistor elements 162, 164, 168a, 168b, as illustrated in FIGS. 25D, 26D. After etching, mask 504 can be removed (e.g., by solvent or ashing).

Figure 25E:
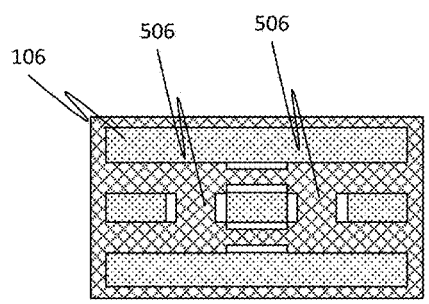
Figure 26E:
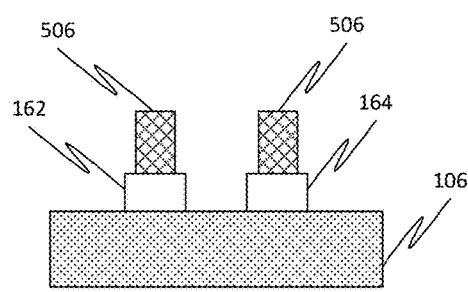

Returning to FIG. 24, the process can then proceed to S406, where a photoresist layer 506 is deposited over the substrate 106 and previously formed resistor elements. In some embodiments, the photoresist layer 506 may be a multi-layer film of different photoresist compositions. The photoresist layer 506 can be patterned (e.g., via photolithography) to serve as a base for a subsequent lift-off process, as illustrated in FIGS. 25E, 26E.

Figure 25F:
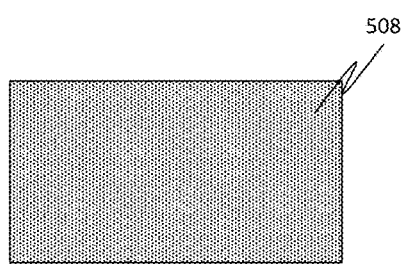
Figure 26F:
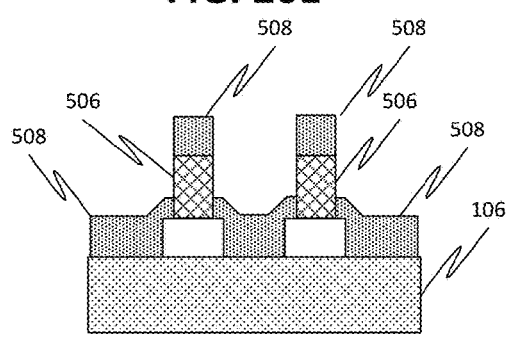
Figure 25G:
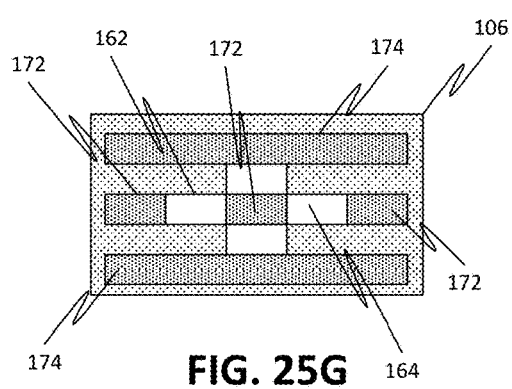
Figure 26G:
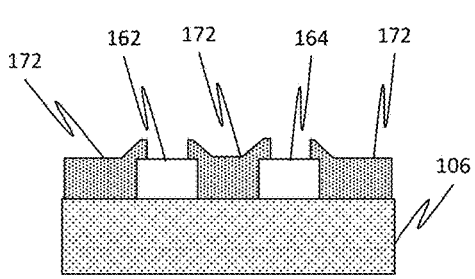

The process can then proceed to S408, where a second material layer 508 for forming the heat-sink/conductors and ground planes can be formed (e.g., via electron beam deposition or evaporation) over the substrate 106, formed resistor elements, and patterned photoresist 506, as illustrated in FIGS. 25F, 26F. The process can then proceed to S410, where the second material layer 508 that rests on the photoresist 506 is removed via lift-off (e.g., by adhering a substrate such as tape to the second material layer 508 and pulling the material off of the device). The photoresist 506 can then be removed (e.g., by solvent or ashing), leaving a completed dissipative device, as illustrated in FIGS. 25G, 26G. In some embodiments, the patterning of the second material layer 508 can also form the heat-sink islands 142 and/or heat-sink spacers 152, as described in further detail above.

Returning to FIG. 24, the process can then proceed to S412, where the dissipative device is diced into individual chips (e.g., when multiple devices are prepared on a single substrate) and assembled into a housing (e.g., the housing discussed with respect to FIGS. 15A-15C) at S414. The mounting may include applying a thermally-conductive layer (e.g., conductive adhesive, conductive paste, or conductive epoxy) between a back surface of the substrate of the chip and the housing.

Once assembled into housing, electrical connections between the housing ports and dissipative device components can be made (e.g., via wire bonding, soldering, and/or conductive paste or epoxy) and the housing sealed at S416. For example, input and output ports can be connected to the resistor elements of the dissipative devices via the heat-sink conductors and connection means (e.g., wires), and a grounding conductor (e.g., ground planes) of the substrate of the dissipative device can be connected to the housing via a thermally conductive layer (e.g., conductive adhesive, conductive paste, or conductive epoxy).

Further details regarding the fabrication method can be found, for example, in the underlying '521 and '191 provisional applications incorporated by reference herein.

Of course, the above described fabrication methods are examples of forming the dissipative devices. However, embodiments of the disclosed subject matter are not limited thereto. Indeed, other fabrication methods, and devices resulting therefrom, are also possible according to one or more contemplated methods. Such other fabrication methods can include, but are not limited to, different methods for forming material layers (e.g., evaporation, chemical vapor deposition, physical vapor deposition, electron beam deposition, sputtering, growing a film from the substrate, etc.), different methods of patterning (e.g., wet etching, reactive ion etching, focused ion beam etching, etc. and/or using different types of photoresist (negative instead of positive)), and/or different order of steps (e.g., forming the conductive material for the heat-sinks/conductors prior to forming the resistor elements rather than after).

Although the description above has focused on a particular application of the disclosed dissipative devices, e.g., as a dissipative cryogenic microwave device for use in a qubit or quantum superconducting system, embodiments of the disclosed subject matter are not limited thereto. Indeed, the disclosed dissipative devices may generally provide efficient cooling of electromagnetic signals from the L-band (e.g., 1-2 GHz) up to the microwave K-band (e.g., 18-27 GHz). Moreover, the disclosed dissipative devices may find application to other cryogenic devices sensitive to thermal noise as well as other cryogenic or non-cryogenic applications.

In this application, unless specifically stated otherwise, the use of the singular includes the plural, and the separate use of "or" and "and" includes the other, i.e., "and/or." Furthermore, use of the terms "including" or "having," as well as other forms such as "includes," "included," "has," or "had," are intended to have the same effect as "comprising" and thus should not be understood as limiting.

Any range described herein will be understood to include the endpoints and all values between the endpoints. Whenever "substantially," "approximately," "essentially," "near," or similar language is used in combination with a specific value, variations up to and including 10% of that value are intended, unless explicitly stated otherwise.

It is thus apparent that there is provided in accordance with the present disclosure, low-noise, ultra-low temperature dissipative devices, fabrication methods thereof, and systems including such dissipative devices. Many alternatives, modifications, and variations are enabled by the present disclosure. While specific examples have been shown and described in detail to illustrate the application of the principles of the present invention, it will be understood that the invention may be embodied otherwise without departing from such principles. For example, disclosed features may be combined, rearranged, omitted, etc. to produce additional embodiments, while certain disclosed features may sometimes be used to advantage without a corresponding use of other features. Accordingly, Applicant intends to embrace all such alternatives, modifications, equivalents, and variations that are within the spirit and scope of the present invention.

The invention claimed is:

1. A dissipative device comprising:
a substrate;
at least one resistor element in contact with the substrate, each resistor element having first and second ends in plan view and comprising a first material having a first electrical conductivity value;
at least two heat sinks in contact with the substrate, one of the heat sinks being coupled to the first end in plan view, another of the heat sinks being coupled to the second end in plan view, each heat sink comprising a second material having a second electrical conductivity value higher than the first electrical conductivity value; and
ground planes in contact with the substrate and comprising the second material,
wherein the at least two heat sinks are constructed to conduct heat generated in the at least one resistor element to the substrate and to cool hot electrons generated by the at least one resistor element via electron-phonon coupling,
wherein the at least one resistor element is at least three resistor elements arranged in one of a T-pad configuration and a π-pad configuration, and constructed as a coplanar waveguide microwave attenuator, and
wherein each resistor element is coupled at the first end thereof to one of the heat sinks and ground planes, and is coupled at the second end thereof to another of the heat sinks and ground planes.

2. The dissipative device according to claim 1, wherein each resistor element comprises:
a plurality of resistor sub-elements arranged in series, each resistor sub-element being formed of the first material; and
a plurality of spacers arranged between the resistor sub-elements in plan view, each spacer comprising the second material,
wherein the plurality of spacers are also constructed to conduct heat generated in the plurality of resistor sub-elements to the substrate and to cool hot electrons generated by the plurality of resistor sub-elements via electron-phonon coupling.

3. The dissipative device according to claim 1, wherein the first material comprises a pure metal, a metal oxide, or a metal alloy.

4. The dissipative device according to claim 3, wherein the first material is 80 weight percent Ni and 20 weight percent Cr.

5. The dissipative device according to claim 1, wherein the first material has a temperature coefficient of resistance that is less than $1 \times 10^{-3}$ per K.

6. The dissipative device according to claim 1, wherein the first material and/or the second material are non-superconductive at a temperature less than 10 mK.

7. The dissipative device according to claim 1, wherein the device is constructed as a dissipative cryogenic microwave device for cooling of electromagnetic signals from L-band up to K-microwave band.

8. The dissipative device according to claim 1, wherein the second material comprises Ag, Au, Cu, or another noble metal.

9. The dissipative device according to claim 1, further comprising a housing that encloses the substrate, the housing having first and second ports coupled to the at least one resistor element.

10. The dissipative device according to claim 9, wherein the housing comprises Ag or Cu.

11. The dissipative device according to claim 9, wherein a back surface of the substrate is in thermal contact with the housing through a thermally-conductive layer comprising a third material having a third electrical conductivity value higher than the first electrical conductivity value.

12. The dissipative device according to claim 11, wherein the thermally-conductive layer is a paste or an epoxy comprising Ag, Au, Cu, or another noble metal.

13. The dissipative device according to claim 9, wherein the housing comprises separate pieces coupled together so as to apply pressure to the substrate.

14. The dissipative device according to claim 1, further comprising a directional coupler, wherein the at least one resistor element is connected to a terminating port of the directional coupler.

15. The dissipative device according to claim 1, wherein the attenuator is constructed to provide 20 dB attenuation and such that, for input microwave power of less than 30 nW, a resulting noise temperature of the attenuator is less than 120 mK in an operating environment less than 20 mK.

16. The dissipative device according to claim 1, wherein the attenuator has a bandwidth from 1 GHz to at least 10 GHz.

17. The dissipative device according to claim 1, wherein the substrate comprises a material having a thermal conductivity of at least 1 $Wm^{-1}K^{-1}$ at 1 K and a relative permittivity less than or equal to 3.9.

18. The dissipative device according to claim 1, wherein the substrate comprises fused quartz, single crystal quartz, sapphire, or silicon having a resistivity greater than 40 ohm-cm.

19. The dissipative device according to claim 1, further comprising a mixing chamber with the substrate thermally coupled thereto and configured to maintain a temperature therein below 1 K.

20. A system comprising:
(a) a dissipative device comprising:
a substrate;
at least one resistor element in contact with the substrate, each resistor element having first and second ends in plan view and comprising a first material having a first electrical conductivity value; and
at least two heat sinks in contact with the substrate, one of the heat sinks being coupled to the first end in plan view, another of the heat sinks being coupled to the second end in plan view, each heat sink comprising a second material having a second electrical conductivity value higher than the first electrical conductivity value; and
(b) a refrigerator configured to cool the substrate to a temperature below 1 K,
wherein the at least two heat sinks are constructed to conduct heat generated in the at least one resistor element to the substrate and to cool hot electrons generated by the at least one resistor element via electron-phonon coupling.

21. The system of claim 20, wherein the dissipative device further comprises:

ground planes in contact with the substrate and comprising the second material, wherein the at least one resistor element is at least three resistor elements arranged in one of a T-pad configuration and a π-pad configuration, and constructed as a coplanar waveguide microwave attenuator, and wherein each resistor element is coupled at the first end thereof to one of the heat sinks and ground planes, and is coupled at the second end thereof to another of the heat sinks and ground planes.

* * * * *